(12) United States Patent
Abe et al.

(10) Patent No.: US 8,053,378 B2
(45) Date of Patent: Nov. 8, 2011

(54) MODIFIED PHENOLIC RESIN, EPOXY RESIN COMPOSITION CONTAINING THE SAME, AND PREPREG CONTAINING THE COMPOSITION

(75) Inventors: Takaharu Abe, Chiba (JP); Sunao Maeda, Ichihara (JP); Tatsuhiro Urakami, Ichihara (JP); Yukio Fukui, Nagoya (JP); Masanobu Maeda, Ichihara (JP); Hiroaki Narisawa, Kamakura (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 1174 days.

(21) Appl. No.: 11/793,710

(22) PCT Filed: Dec. 16, 2005

(86) PCT No.: PCT/JP2005/023183
§ 371 (c)(1),
(2), (4) Date: Jun. 21, 2007

(87) PCT Pub. No.: WO2006/068063
PCT Pub. Date: Jun. 29, 2006

(65) Prior Publication Data
US 2008/0044667 A1 Feb. 21, 2008

(30) Foreign Application Priority Data

Dec. 21, 2004 (JP) ................................ 2004-368757
Jul. 20, 2005 (JP) ................................ 2005-209444

(51) Int. Cl.
*B32B 17/02* (2006.01)
(52) U.S. Cl. ...................................... 442/180; 428/901
(58) Field of Classification Search .................. 442/180; 428/901
See application file for complete search history.

(56) References Cited

U.S. PATENT DOCUMENTS
3,919,167 A 11/1975 Mark

FOREIGN PATENT DOCUMENTS

| JP | 50-116542 A | 9/1975 |
|---|---|---|
| JP | 02-073824 A | 3/1990 |
| JP | 08-333428 A | 12/1996 |
| JP | 09-020819 A | 1/1997 |
| JP | 09-124755 A | 5/1997 |
| JP | 10-237060 A | 9/1998 |
| JP | 10-268522 A | 10/1998 |
| JP | 10-274853 A | 10/1998 |
| JP | 2001-064340 A | 3/2001 |
| JP | 2003-286392 A | 10/2003 |

*Primary Examiner* — Lynda Salvatore
(74) *Attorney, Agent, or Firm* — Buchanan Ingersoll & Rooney PC

(57) ABSTRACT

A modified phenolic resin that is an alternate copolymer of at least one phenolic compound selected from phenol, naphthols, and their derivatives and a compound having a divalent connecting group, said modified phenolic resin having a side chain attached to an aromatic ring having a hydroxy group, said side chain being represented by defined formula (1-1). The modified phenolic resin can be used as a hardener for epoxy resins and a cured product thereof has excellent adhesion and flame retardancy without impairing properties of conventional phenolic resins such as gel time, glass transition temperature, moisture absorption, and mechanical properties. The epoxy resin composition can provide excellent adhesion and flame retardancy as hardeners for semiconductor sealing epoxy resins, insulating materials for electrical/electronic components, and laminates (printed circuit boards). A prepreg containing a glass substrate impregnated with the epoxy resin composition, a laminate, and an electronic circuit board are also provided.

26 Claims, No Drawings

MODIFIED PHENOLIC RESIN, EPOXY RESIN COMPOSITION CONTAINING THE SAME, AND PREPREG CONTAINING THE COMPOSITION

TECHNICAL FIELD

The present invention relates to a modified phenolic resin, a production method thereof, an epoxy resin composition containing the modified phenolic resin, and a cured product thereof. More specifically, the present invention relates to a modified phenolic resin used in insulating materials for electrical/electronic components such as a hardener for semiconductor-sealing epoxy resins, laminates such as printed circuit boards, adhesives, molding materials, paints, and others.

The present invention also relates to a prepreg using an epoxy resin composition, a laminate, and an electronic circuit board. More specifically, the present invention relates to a prepreg composed of a glass substrate impregnated with an epoxy resin composition with improved heat resistance, flame retardancy, and adhesion that contains an epoxy compound or epoxy resin, a hardener comprising a modified phenolic resin, and a curing accelerator; a laminate formed by stacking the prepregs; and an electronic circuit board made by using the laminate.

BACKGROUND ART

Phenolic resins are useful compounds as hardeners for semiconductor-sealing epoxy resins, source materials for epoxy resins, adhesives, molding materials, and paints. Phenolic resins are widely used in electrical/electronic components, structural materials, adhesives, paints, and other fields, since cured phenolic resins have excellent electrical properties, heat resistance, adhesion, moisture resistance, and others.

Further, with advancement in the electrical/electronics field, semiconductor-sealing epoxy resins are required to have various properties such as high purity, heat resistance, moisture resistance, adhesion, low viscosity ensuring high filler content, low dielectric constant, rapid curing performance, and flame retardancy. In particular, lead-free soldering, which is introduced to meet environmental problems, requires soldering temperature higher than before, so that there is demand for improving adhesion between chips and frames composing IC and the sealing resin or adhesion between the filler and sealing resin to prevent separation or crack of packages.

In addition, because of the regulation on use of conventional bromine-containing flame retardants, the flame retardancy of the resin itself is also required to be improved.

In order to solve these problems, Japanese Patent Laid-Open Publication No. 2003-286392 describes a technique of improving adhesion of an epoxy composition by adding dibenzothiophene for prevention of cracks caused on packages by heating in reflow soldering process. However, since the above compound is quite inert and has a low boiling point of around 330° C., there are problems in heat resistance and flame retardancy.

Japanese Patent Laid-Open Publication No. H10-237060 discloses a technique of preventing package separation by improving adhesion using polyhydric phenols prepared through polycondensation between hetero aldehydes and phenols. However, production of these polyhydric phenols requires a long reaction time because of extremely low reactivity and has difficulty in producing high polymers. Also, the production involves many steps, such as neutralization of alkaline water and repeated washing of resulting salts, and generates a large amount of wastewater in neutralization and washing. Furthermore, there are a number of problems including slow curing speed of molded products and lowering in mechanical strength.

Phenolic resins are useful compounds as hardeners for electronic circuit board epoxy resins, source materials for epoxy resins, or the like. Since cured phenolic resins are excellent in electrical properties, heat resistance, adhesion, moisture resistance, and others, fiber-reinforced resin boards in which a phenolic resin is incorporated into a fiber base and cured to form a matrix, for example, laminates made of fiber-reinforced resin are widely used as electrical insulating materials or the like in the field of electrical/electronic components.

The fiber-reinforced resin board with phenolic resin matrix can be produced as follows: a fiber base is impregnated with a phenolic resin varnish in which a phenolic resin is dissolved in an organic solvent and the varnish is dried to prepare a semi-cured prepreg; a predetermined number of prepregs are stacked; and the resin is fully cured.

As examples of phenolic resins used for producing such fiber-reinforced resin boards, there may be mentioned resol-type phenolic resins. However, fiber-reinforced resin boards using resol-type phenolic resins have disadvantages of low electrical insulation and inadequate heat resistance. In order to resolve these disadvantages, Japanese Patent Laid-Open Publication No. H02-73824 proposes fiber-reinforced resin boards using various novolac-type phenolic resins as matrix. However, the boards were inadequate in flame retardancy, and addition of a bromine-containing flame retardant was required to impart flame retardancy to the resin composition.

Because of the European Union regulation on use of conventional bromine-containing flame retardants, the flame retardancy of the resin itself is also required to be improved.

On the other hand, as method for manufacturing multilayer printed circuit boards in place of the conventional laminating press process, there has been intensively developed so-called build-up process in which organic insulating films and conductive layers are alternatively laminated without glass fabric, which is disadvantageous in dielectric properties.

In the build-up process, a rubber component is sometimes added to enhance adhesion between the insulating layer and conductive layer. The rubber component remaining in the insulating layer, in some cases, deteriorates performances such as heat resistance and electrical insulation. Therefore, improvement in adhesion of resin itself is requested.

DISCLOSURE OF THE INVENTION

Problems to be Solved by the Invention

It is an object of the present invention to provide a modified phenolic resin that can provide epoxy resins with excellent adhesion and flame retardancy used in insulating materials for electrical/electronic components such as semiconductor-sealing materials, laminates such as printed circuit boards, adhesives, molding materials, paints and other applications; a method for producing the phenolic resin; and an epoxy resin composition using the phenolic resin as a hardener.

Another object of the present invention is to provide a prepreg prepared by impregnating a glass substrate with an epoxy resin composition that contains a specific modified phenolic resin as a hardener, and has, in addition to electrical insulation required as electrical/electronic materials, improved heat resistance, flame retardancy, and adhesion; a laminate; and an electronic circuit board.

Means for Solving the Problems

The present inventors have intensively studied to achieve the above objects and found a novel modified phenolic resin that can provide epoxy resins with excellent adhesion and flame retardancy used in insulating materials for electrical/electronic components, laminates, adhesives, molding materials, paints, and others, wherein the modified phenolic resin is obtained by substitution reaction of an aromatic ring having a hydroxyl group in a phenolic resin with a compound represented by general formula (6-1) in the presence of an acid catalyst.

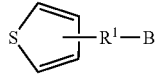
(6-1)

(In the formula, $R^1$ represents a $C_{1-8}$ linear, branched, or cyclic hydrocarbon group; and B represents a hydroxyl group or halogen atom.) Thus, they completed the present invention.

Namely, the modified phenolic resin according to the present invention is characterized in that:
[1] It has a structure in which a side chain of an aromatic ring having a hydroxyl group in a phenolic resin that is an alternate copolymer of at least one phenolic compound selected from phenol, naphthols, and their derivatives and a compound having a divalent connecting group, is/are substituted with a group represented by general formula (1-1)

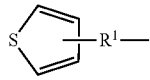
(1-1)

(In the formula, $R^1$ represents a $C_{1-8}$ linear, branched, or cyclic hydrocarbon group.);
[2] Sulfur atoms are present in an amount of 0.01 to 2 moles per mole of hydroxyl groups in the modified phenolic resin described in [1];
[3] The modified phenolic resin described in [1] or [2] is represented by general formula (2-1)

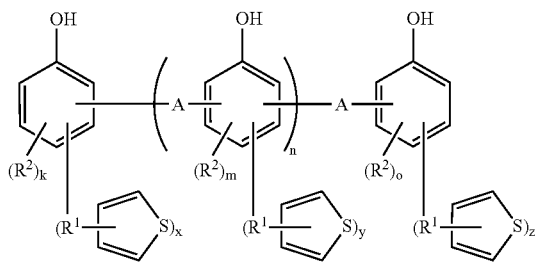
(2-1)

(In the formula, $R^1$ represents a $C_{1-8}$ linear, branched, or cyclic hydrocarbon group; $R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; each of k, o, x and z represents an integer of 0 to 4; each of m and y represents an integer of 0 to 3; the sum of x, y, and z is an integer of 1 to 11; and the recurring unit number, n, represents an integer of 0 to 50.);
[4] The modified phenolic resin described in [1] or [2] is represented by general formula (3-1)

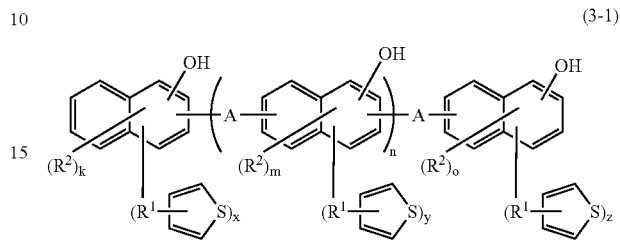
(3-1)

(In the formula, $R^1$ represents a $C_{1-8}$ linear, branched, or cyclic hydrocarbon group;
$R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; each of k, o, x, and z represents an integer of 0 to 6; each of m and y represents an integer of 0 to 5; the sum of x, y, and z is an integer of 1 to 17; and the recurring unit number, n, represents an integer of 0 to 50.);
[5] Connecting group A in the modified phenolic resin described in [3] or [4] is at least one group selected from methylene group, xylylene groups, biphenylaralkyl groups, and groups represented by general formula (4-1)

(4-1)

[6] The method for producing the modified phenolic resin represented by general formula (2-1) comprises reacting a phenolic resin represented by general formula (5-1) and a compound represented by general formula (6-1) in the presence of an acid catalyst

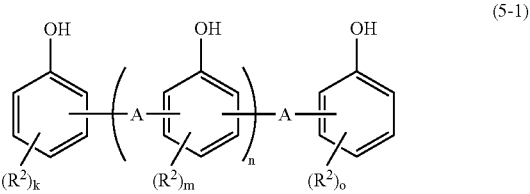
(5-1)

(In the formula, $R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; k and o, each, represent an integer of 0 to 4; m represents an integer of 0 to 3; and the recurring unit number, n, represents an integer of 0 to 50.)

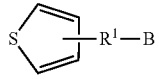

(6-1)

(In the formula, $R^1$ represents a $C_{1-8}$ linear, branched, or cyclic hydrocarbon group; and B is a hydroxyl group or halogen atom.);

[7] The method for producing the modified phenolic resin represented by general formula (3-1) comprises reacting a phenolic resin represented by general formula (7-1) and a compound represented by general formula (6-1) in the presence of an acid catalyst

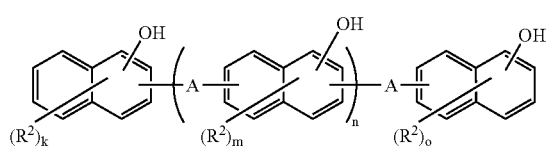

(7-1)

(In the formula, $R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; k and o, each, represent an integer of 0 to 6; m represents an integer of 0 to 5; and the recurring unit number, n, represents an integer of 0 to 50.)

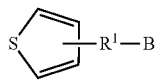

(6-1)

(In the formula, $R^1$ represents a $C_{1-8}$ linear, branched, or cyclic hydrocarbon group; and B represents a hydroxyl group or halogen atom.);

[8] The method for producing the modified phenolic resin described in [6] or [7] is characterized in that connecting group A is at least one group selected from methylene group, xylylene groups, biphenylaralkyl groups, and groups represented by general formula (4-1);

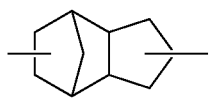

(4-1)

[9] The epoxy resin composition according to the present invention is an epoxy resin composition containing bi- or poly-functional epoxy compound or bi- or poly-functional epoxy resin (A), hardener (B), and curing accelerator (C), wherein hardener (B) is the modified phenol described in any of [1] to [5];
[10] The epoxy resin composition described in [9] contains 100 to 1900 parts by mass organic and/or inorganic filler (D) relative to 100 parts by mass of the total of bi- or poly-functional epoxy compound or bi- or poly-functional epoxy resin (A) and hardener (B); and
[11] The cured epoxy resin according to the present invention is obtained by thermal-curing the epoxy resin composition described in [9] or [10].

The prepreg composed of a glass substrate impregnated with the epoxy resin composition of the present invention, the laminate formed by stacking the prepregs, and the electronic circuit board made by using the laminate have the following characteristics.

[1] The prepreg according to the present invention is composed of a glass substrate impregnated with an epoxy resin composition that contains bi- or poly-functional epoxy compound or bi- or poly-functional epoxy resin (A), hardener (B), and curing accelerator (C), wherein hardener (B) is a modified phenolic resin which is a phenolic resin that is an alternate copolymer of at least one phenolic compound selected from phenol, naphthols, and their derivatives and a compound having a divalent connecting group in which a side chain of an aromatic ring having a hydroxyl group is substituted with a group represented by general formula (1-1)

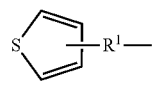

(1-1)

(In the formula, $R^1$ represents a $C_{1-8}$ linear, branched, or cyclic hydrocarbon group.).

[2] In the prepreg described in [1], hardener (B) is a modified phenolic resin in which a side chain of an aromatic ring having a hydroxyl group in a phenolic resin that is an alternate copolymer of at least one phenolic compound selected from phenol, naphthols, and their derivatives and a compound having a divalent connecting group, is substituted with a group represented by general formula (1-2)

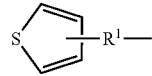

(1-2)

(In the formula, $R^1$ represents a $C_{1-3}$ alkylene, 1,4-cyclohexylene, or phenylene group.).

[3] In the prepreg described in [1], hardener (B) is a modified phenolic resin represented by general formula (2-2)

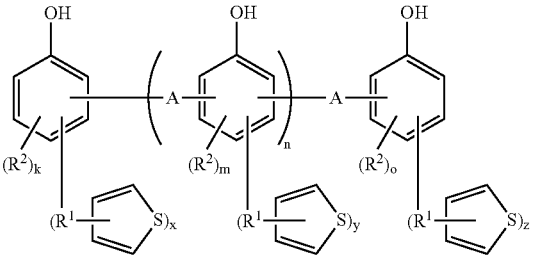

(2-2)

(In the formula, $R^1$ represents a $C_{1-3}$ alkylene, 1,4-cyclohexylene, or phenylene group; $R^2$s may be identical or different and each represent a hydrogen atom, fluorine atom, chlorine atom, hydroxyl, phenyl, $C_{1-3}$ alkyl, or $C_{1-3}$ alkoxy group;

connecting group A represents a $C_{1-3}$ alkylene, $C_{6-12}$ divalent alicyclic hydrocarbon, phenylene, xylylene, or biphenylaralkyl group; each of k, o, x and z represents an integer of 0 to 4; each of m and y represents an integer of 0 to 3; the sum of x, y, and z is an integer of 1 to 11; and the recurring unit number, n, represents an integer of 0 to 50.).

[4] In the prepreg described in [1], hardener (B) is a modified phenolic resin represented by general formula (3-2)

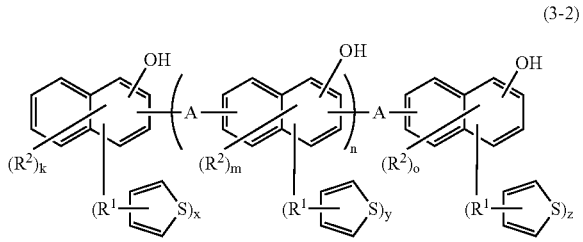

(3-2)

(In the formula, $R^1$, $R^2$, connecting group A, k, o, x, z, m, y, and the recurring unit number, n, are as defined above.).

[5] In the prepreg described in [3] or [4], the modified phenolic resin is characterized in that connecting group A is at least one group selected from methylene group, xylylene groups, biphenylaralkyl group, and groups represented by general formula (4-1).

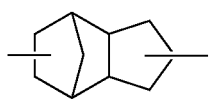

(4-1)

[6] In the prepreg described in any of [1] to [5], the glass substrate is impregnated with an epoxy resin composition having an epoxy equivalent of 170 to 1000 g/eq.

[7] In the prepreg described in any of [1] to [6], the glass substrate is impregnated with an epoxy resin composition containing 2 to 150 parts by weight of hardener (B) relative to 100 parts by weight of bi- or poly-functional epoxy compound or bi- or poly-functional epoxy resin (A).

[8] The laminate according to the present invention is formed by stacking prepregs described in any of [1] to [7].

[9] The electronic circuit board according to the present invention is made using the laminate described in [8].

Effects of the Invention

The modified phenolic resin of the present invention exhibits excellent adhesion and flame retardancy when used as a hardener for epoxy resins, having extremely high industrial value.

Further, use of the modified phenolic resin of the present invention as a hardener for epoxy resins provides a prepreg composed of a glass substrate impregnated with an epoxy resin composition having improved heat resistance, flame retardancy, and adhesion as well as electrical insulation required for electrical/electronic materials; a laminate formed by stacking the prepregs; and an electronic circuit board made by using the laminate.

BEST MODE FOR CARRYING OUT THE INVENTION

Hereinafter, the modified phenolic resin according to the present invention, the production method thereof, the epoxy resin composition containing the modified phenolic resin as a hardener, and the cured product thereof are specifically described.

[Modified Phenolic Resin of the Present Invention]

The modified phenolic resin of the present invention has a structure in which a side chain of an aromatic ring having a hydroxyl group in a phenolic resin is substituted with a group represented by general formula (1-1). The phenolic resin is an alternate copolymer of at least one phenolic compound selected from phenol, naphthols, and their derivatives (hereinafter, called phenolic compound) and a compound having a divalent connecting group.

(1-1)

(In the formula, $R^1$ represents a $C_{1-8}$ linear, branched, or cyclic hydrocarbon group.)

Specific examples of $R^1$ in the group represented by general formula (1-1) include methylene, ethylene, trimethylene, tetramethylene, pentamethylene, hexamethylene, heptamethylene, octamethylene, ethylethylene, 2-methyltetramethylene, 2-methylhexamethylene, 2-ethylhexamethylene, 1,3-cyclobutylene, 1,3-cyclopentylene, 1,4-cyclohexylene, 1,4-cyclo-octylene, vinylene, propenylene, butanediylidene, 1-propanyl-3-ylidene, o-phenylene, m-phenylene, p-phenylene, 3-cyclohexen-1,2-ylene, 2,5-cyclohexadien-1,4-ylene, and others. Among these, methylene and ethylene are particularly preferable.

In the modified phenolic resin of the present invention, it is desirable that the sulfur atom is contained in an amount of 0.01 to 2 moles, preferably 0.05 to 1.5 moles, and more preferably 0.1 to 1 mol, per mole of hydroxyl groups in the modified phenolic resin.

The hydroxyl content of the modified phenolic resin can be estimated by acetylating the resin with acetic anhydride in a solvent such as pyridine, followed by hydrolyzing the excess reagent to give acetic acid, which is titrated with a potassium hydroxide solution. The sulfur atom content can be estimated by measuring NMR in chloroform or otherwise.

Such modified phenolic resin includes compounds represented by general formula (2-1) below.

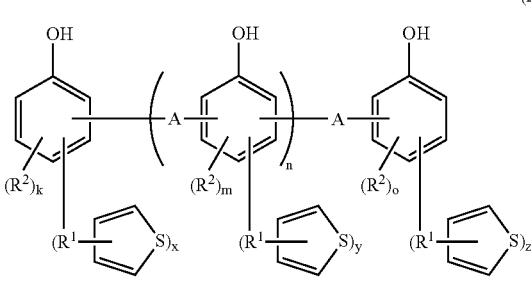

(2-1)

(In the formula, $R^1$ represents a $C_{1-8}$ linear, branched, or cyclic hydrocarbon group; $R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; each of k, o, x and z represents an integer of 0 to 4; each of m and y represents an integer of 0 to 3; the sum of x, y, and z is an integer of 1 to 11; and the recurring unit number, n, represents an integer of 0 to 50.)

The modified phenolic resin also includes compounds represented by general formula (3-1) below.

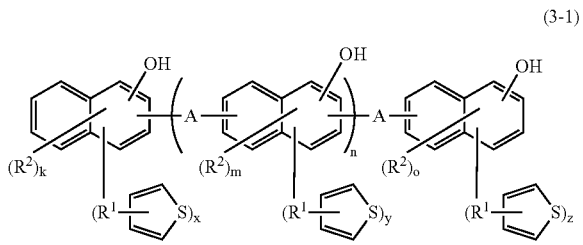

(3-1)

(In the formula, $R^1$ represents a $C_{1-8}$ linear, branched, or cyclic hydrocarbon group; $R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; each of k, o, x and z represents an integer of 0 to 6; each of m and y represents an integer of 0 to 5; the sum of x, y, and z is an integer of 1 to 17; and the recurring unit number, n, represents an integer of 0 to 50.)

In the modified phenolic resin represented by general formula (2-1) or (3-1), $R^1$ specifically includes methylene, ethylene, trimethylene, tetramethylene, pentamethylene, hexamethylene, heptamethylene, octamethylene, ethylethylene, 2-methyltetramethylene, 2-methylhexamethylene, 2-ethylhexamethylene, 1,3-cyclobutylene, 1,3-cyclopentylene, 1,4-cyclohexylene, 1,4-cyclo-octylene, vinylene, propenylene, butanediylidene, 1-propanyl-3-ylidene, o-phenylene, m-phenylene, p-phenylene, 3-cyclohexen-1,2-ylene, 2,5-cyclohexadien-1,4-ylene, and others. Among these, methylene and ethylene are particularly preferable.

$R^2$ includes, specifically, methyl, ethyl, propyl, butyl, pentyl, hexyl, heptyl, octyl, nonyl, decyl, isopropyl, isobutyl, isopentyl, isohexyl, neopentyl, tert-butyl, tert-pentyl, cyclopropyl, cyclobutyl, cyclopentyl, cyclohexyl, cyclooctyl, cyclodecyl, methoxy, ethoxy, propoxy, butoxy, phenoxy, isopropoxy, isobutoxy, sec-butoxy, tert-butoxy, phenyl, naphthyl, anthryl, phenanthryl, and others. Among these, hydrogen atom, halogen atom, hydroxyl, methyl, and methoxy are particularly preferred.

Connecting group A may be any divalent group, specifically including methylene, ethylene, trimethylene, tetramethylene, pentamethylene, hexamethylene, heptamethylene, octamethylene, nonamethylene, decamethylene, groups represented by general formula (4-1), 1,3-cyclopentylene, 1,4-cyclohexylene, 1,4-cyclooctylene, vinylene, propenylene, butanediylidene, 1-propanyl-3-ylidene, o-phenylene, m-phenylene, p-phenylene, 3-cyclohexen-1,2-ylene, 2,5-cyclohexadien-1,4-ylene, 1,2-xylylene, 1,3-xylylene, 1,4-xylylene, 1,2-xylylenebiphenyl, 1,3-xylylenebiphenyl, 1,4-xylylenebiphenyl, and others. Among these, for attaining the effects of the present invention, that is, excellent adhesion and flame retardancy, connecting group A is particularly preferably methylene, 1,2-xylylene, 1,3-xylylene, 1,4-xylylene, 1,2-xylylenebiphenyl, 1,3-xylylenebiphenyl, 1,4-xylylenebiphenyl, or a group represented by general formula (4-1).

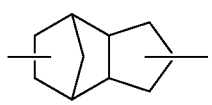

(4-1)

In general formula (2-1), each of x and z is an integer of 0 to 4, preferably an integer of 0 to 2, and more preferably an integer of 0 to 1; y represents an integer of 0 to 3, preferably an integer of 0 to 2, and more preferably an integer of 0 to 1; the sum of x, y, and z is an integer of 1 to 11, preferably an integer of 1 to 5, and more preferably an integer of 1 to 3; and the recurring unit number, n, represents an integer of 0 to 50, and preferably an integer of 0 to 15.

In general formula (3-1), each of x and z is an integer of 0 to 6, preferably an integer of 0 to 3, and more preferably an integer of 0 to 1; y is an integer of 0 to 5, preferably an integer of 0 to 2, and more preferably an integer of 0 to 1; the sum of x, y, and z is an integer of 1 to 17, preferably an integer of 1 to 10, and more preferably an integer of 1 to 3; and the recurring unit number, n, represents an integer of 0 to 50, and preferably an integer of 0 to 15.

Owing to its specific structure in which the side chain of an aromatic ring having a hydroxyl group is substituted with a group represented by general formula (1-1), the modified phenolic resin of the present invention has greatly enhanced adhesion and flame retardancy without any deterioration in curing property, glass transition temperature, moisture absorption, and mechanical properties such as flexural strength of conventional phenol-novolac resins and phenol-aralkyl resins.

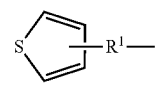

(1-1)

(In the formula, $R^1$ represents a $C_{1-8}$ linear, branched, or cyclic hydrocarbon group.)

Depending on the phenolic resin structure, it is preferred that the duration of moisture resistance is 100 to 130 hours for the modified phenol-novolac resin of the present invention, 100 to 148 hours for the modified phenol-dicyclopentadiene resin of the present invention, 300 to 408 hours for the modified phenol-aralkyl resin of the present invention, 300 to 408 hours for the modified phenol-biphenylaralkyl resin of the present invention, and 300 to 374 hours for the modified naphthol-aralkyl resin of the present invention. The flame retardancy is preferably V-1, and more preferably V-0 in the UL94 test.

Chemical formulae (1) to (20) below illustrate specific examples of the modified phenolic resin of the present invention having the specific structure represented by general formula (2-1) or (3-1).

Chemical Formula (1):

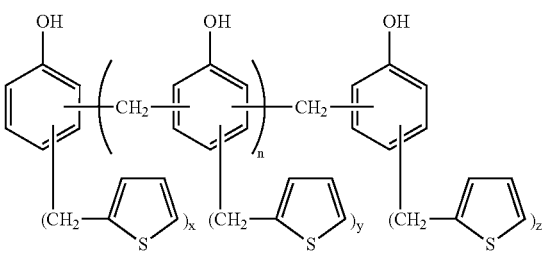

(1)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (2):

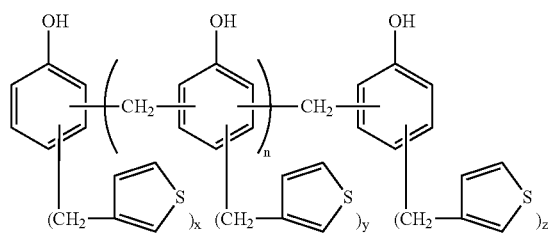

(2)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (3):

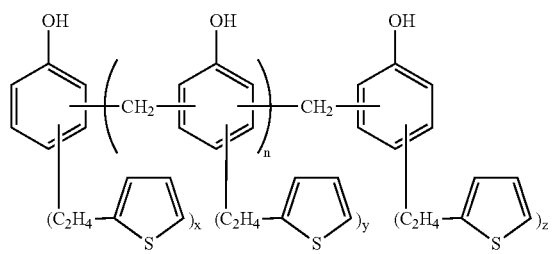

(3)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (4):

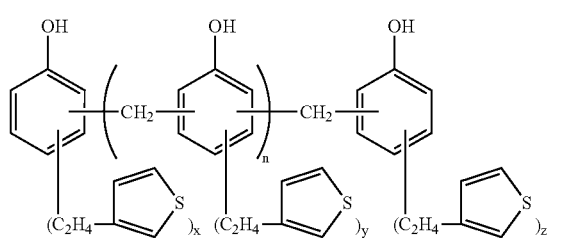

(4)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (5):

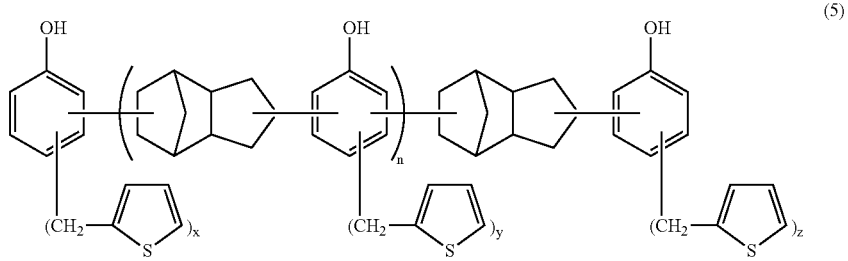

(5)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (6):

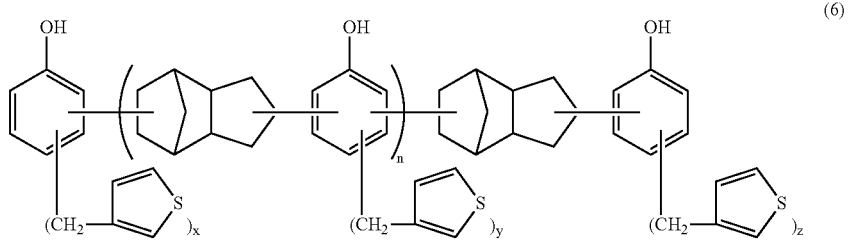

(6)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (7):

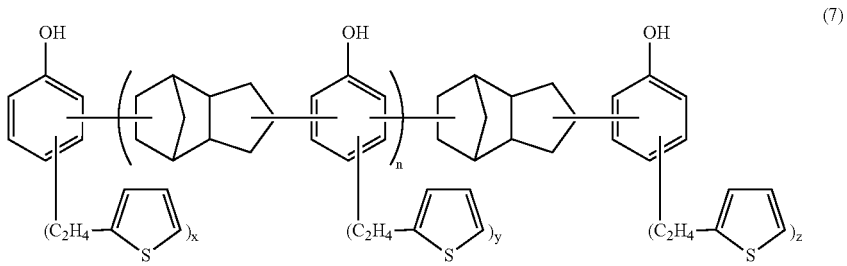

(7)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (8):

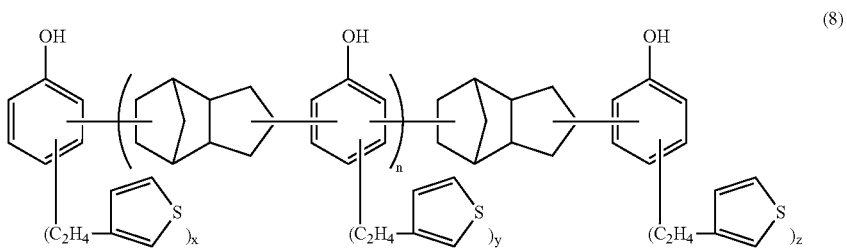

(8)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (9):

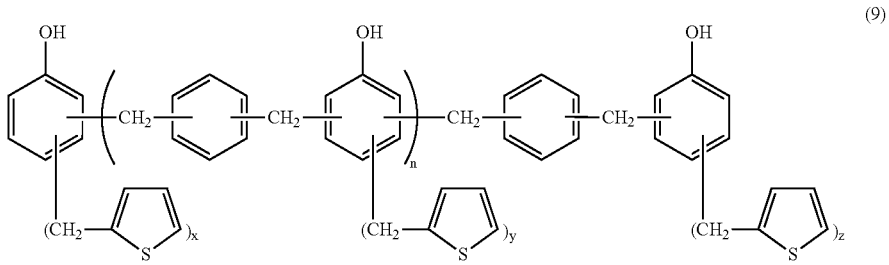

(9)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (10):

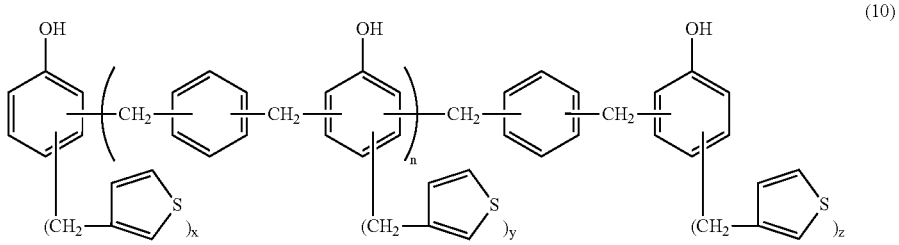

(10)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (11):

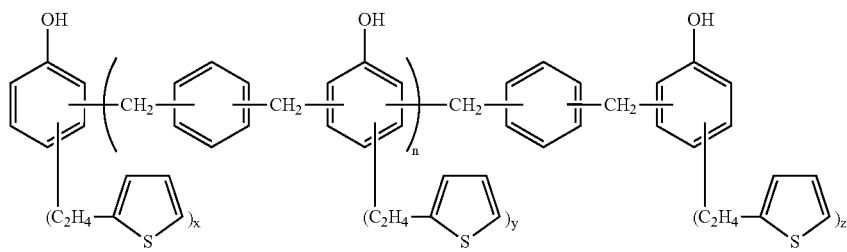

(11)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (12):

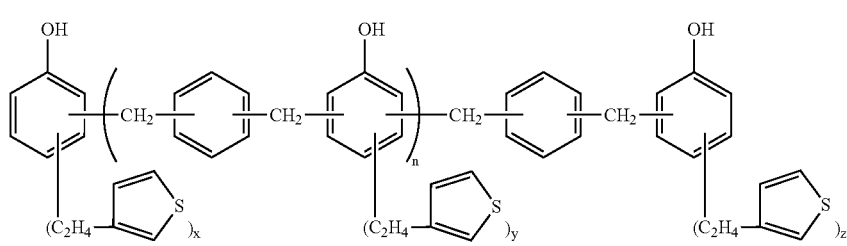

(12)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (13):

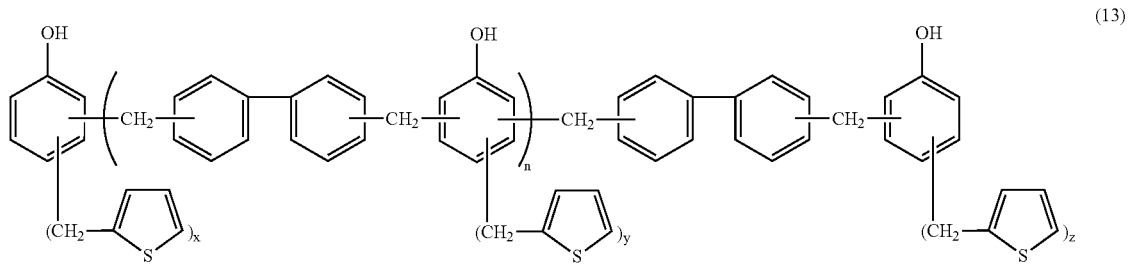

(13)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (14):

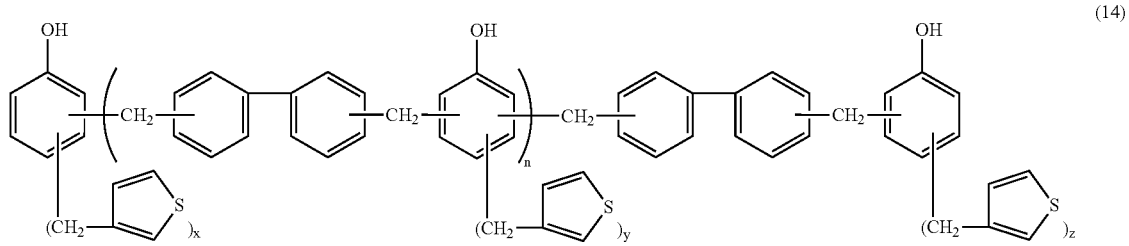

(14)

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (15):

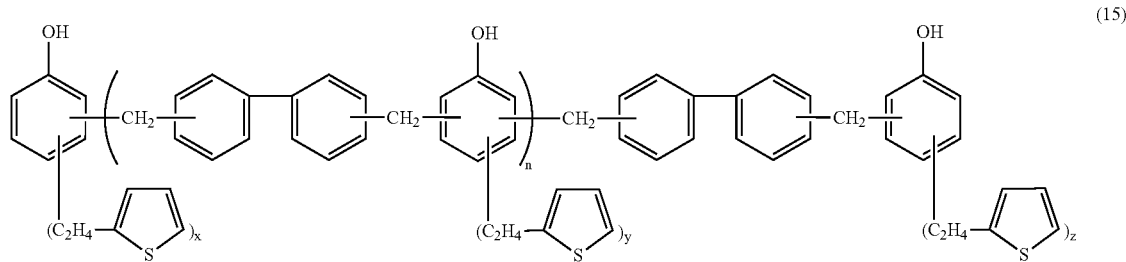

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (16):

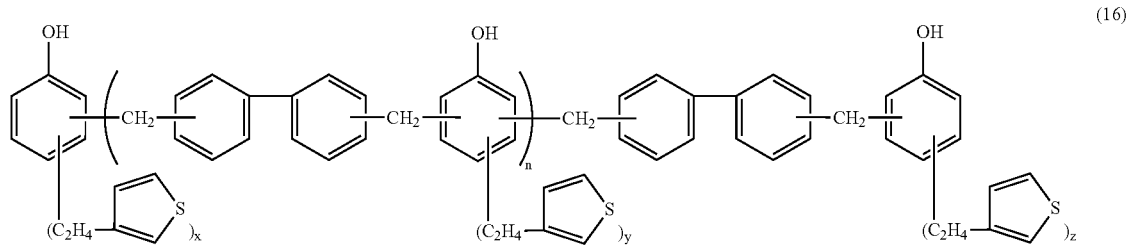

(In the formula, each of x and z represents an integer of 0 to 4; y represents an integer of 0 to 3; the sum of x, y, and z is an integer of 1 to 11; and the recurring unit number, n, represents an integer of 0 to 50.)

Chemical Formula (17):

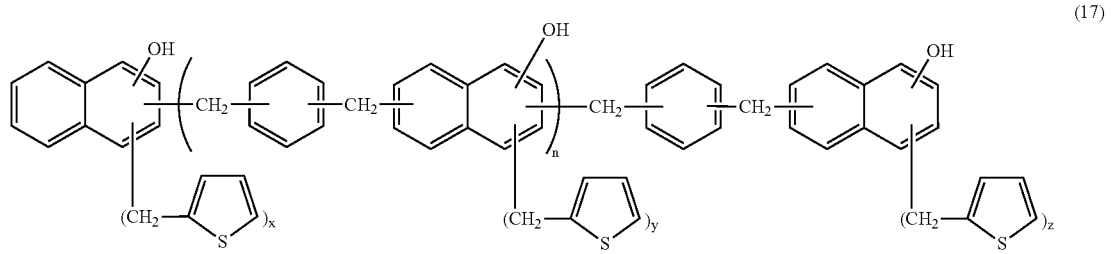

(In the formula, each of x and z represents an integer of 0 to 6; y represents an integer of 0 to 5; the sum of x, y, and z is an integer of 1 to 17; and the recurring unit number, n, represents an integer of 0 to 50.) The hydroxyl group and the group represented by general formula (1-1) may be substituted at any position of the naphthalene ring.

Chemical Formula (18):

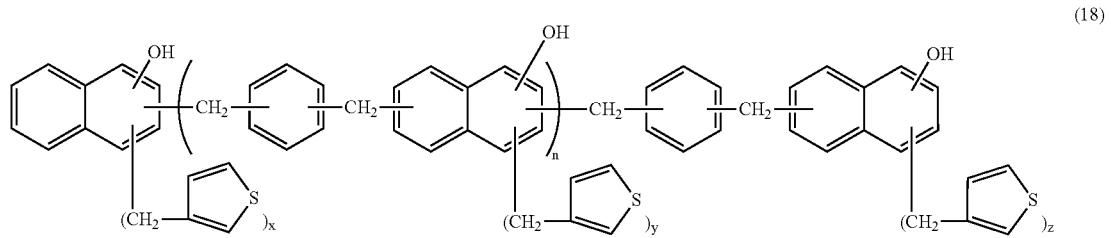

(In the formula, each of x and z represents an integer of 0 to 6; y represents an integer of 0 to 5; the sum of x, y, and z is an integer of 1 to 17; and the recurring unit number, n, represents an integer of 0 to 50.) The hydroxyl group and the group represented by general formula (1-1) may be substituted at any position of the naphthalene ring.

Chemical Formula (19):

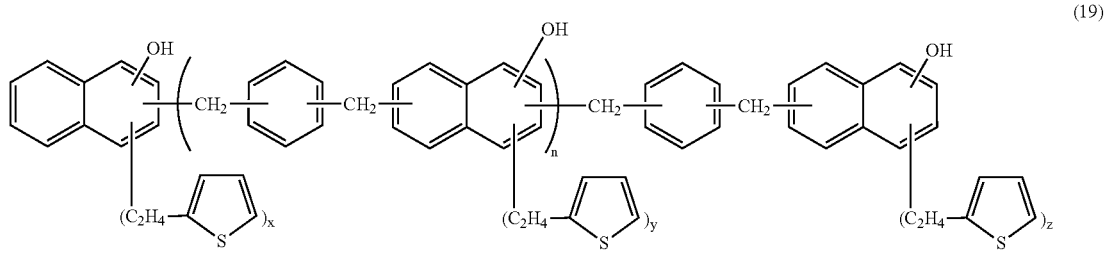

(19)

(In the formula, each of x and z represents an integer of 0 to 6; y represents an integer of 0 to 5; the sum of x, y, and z is an integer of 1 to 17; and the recurring unit number, n, represents an integer of 0 to 50.) The hydroxyl group and the group represented by general formula (1-1) may be substituted at any position of the naphthalene ring.

Chemical Formula (20):

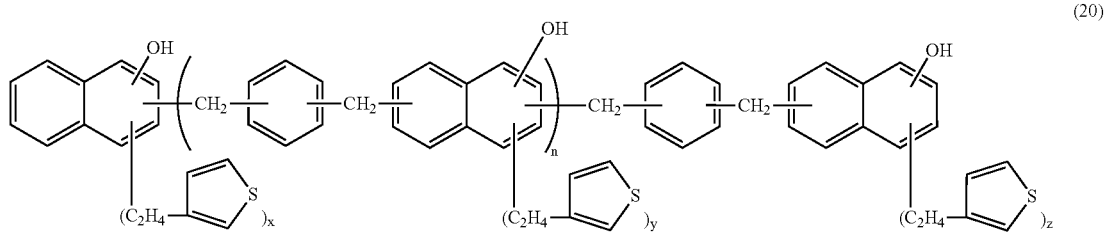

(20)

(In the formula, each of x and z represents an integer of 0 to 6; y represents an integer of 0 to 5; the sum of x, y, and z is an integer of 1 to 17; and the recurring unit number, n, represents an integer of 0 to 50.) The hydroxyl group and the group represented by general formula (1-1) may be substituted at any position of the naphthalene ring.

Among the modified phenol-novolac resin, modified phenol-dicylopentadiene resin, modified phenol-aralkyl resin, modified phenol-biphenylaralkyl resin, and modified naphthol-aralkyl resin represented by chemical formulae (1) to (20), the compounds represented by chemical formula (1), chemical formula (2), chemical formula (5), chemical formula (6), chemical formula (9), chemical formula (10), chemical formula (13), chemical formula (14), chemical formula (17), and chemical formula (18) are preferable, because they exhibit especially excellent adhesion and flame retardancy.

[Method for Producing the Modified Phenolic Resin of the Present Invention]

The modified phenolic resin of the present invention has a structure in which a side chain of an aromatic ring having a hydroxyl group in a phenolic resin that is an alternate copolymer of at least one phenolic compound selected from phenol, naphthols, and their derivatives and a compound having a divalent connecting group, is substituted with a group represented by general formula (1-1). The modified phenolic resin can be obtained by reacting said phenolic resin and a compound represented by general formula (6-1) in the presence of an acid catalyst.

(6-1)

(In the formula, $R^1$ represents a $C_{1-8}$ linear, branched, or cyclic hydrocarbon group; and B represents a hydroxyl group or halogen atom.)

The modified phenolic resin represented by general formula (2-2), which is the modified phenolic resin of the present invention, is obtained by reacting a phenolic resin represented by general formula (5-1) below, which is a phenolic resin that is an alternate copolymer of at least one phenolic compound selected from phenol, naphthols, and their derivatives and a compound having a divalent connecting group, and the compound represented by general formula (6-1) in the presence of an acid catalyst.

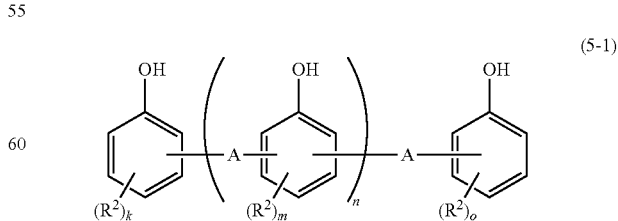

(5-1)

(In the formula, $R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; k and o, each, represent an integer of 0 to 4; m represents an integer of 0 to 3; and the recurring unit number, n, represents an integer of 0 to 50.)

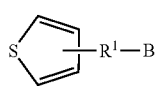

(6-1)

(In the formula, $R^1$ represents a $C_{1-8}$ linear, branched, or cyclic hydrocarbon group; and B is a hydroxyl group or halogen atom.)

The modified phenolic resin represented by general formula (3-1) is obtained specifically by reacting a phenolic resin represented by general formula (7-1) below, which is a phenolic resin that is an alternate copolymer of at least one phenolic compound selected from phenol, naphthols, and their derivatives and a compound having a divalent connecting group, and the compound represented by general formula (6-1) in the presence of an acid catalyst.

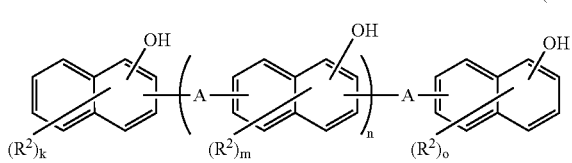

(7-1)

(In the formula, $R^2$s may be identical or different and each of them represents a hydrogen atom, halogen atom, hydroxyl group, phenyl group, or $C_{1-10}$ linear, branched, or cyclic alkyl or alkoxy group; connecting group A represents a $C_{1-20}$ hydrocarbon group; k and o, each, represent an integer of 0 to 6; m represents an integer of 0 to 5; and the recurring unit number, n, represents an integer of 0 to 50.)

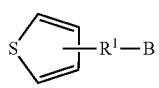

(6-1)

(In the formula, $R^1$ represents a $C_{1-8}$ linear, branched, or cyclic hydrocarbon group; and B represents a hydroxyl group or halogen atom.)

In the present invention, the phenolic resin represented by general formula (5-1) includes, specifically, phenol-novolac resin, phenol-dicyclopentadiene resin, phenol-aralkyl resin, and phenol-biphenylaralkyl resin. The phenolic resin represented by general formula (7-1) includes naphthol-aralkyl resin and others. These phenolic resins may be used alone or in combination of two or more.

The phenol-novolac resin, one of the phenolic resins of the present invention represented by general formula (5-1) or (7-1), is obtained by reacting a phenolic compound and formaldehyde in the presence of an acid catalyst. The phenolic compound used here includes phenol, o-cresol, m-cresol, p-cresol, o-ethylphenol, m-ethylphenol, p-ethylphenol, and others.

The phenol-dicyclopentadiene resin is obtained by reacting a phenolic compound and dicyclopentadiene. The phenolic compound used here includes phenol, o-cresol, m-cresol, p-cresol, o-ethylphenol, m-ethylphenol, p-ethylphenol, p-n-propylphenol, p-isopropylphenol, p-n-butylphenol, p-sec-butylphenol, p-tert-butylphenol, octylphenol, nonylphenol, p-cyclohexylphenol, 2,4-xylenol, 2,6-xylenol, 4,6-xylenol, 3,5-xylenol, 2,4,6-trimethylphenol, 2-methoxyphenol, 3-methoxyphenol, 4-methoxyphenol, o-phenylphenol, m-phenylphenol, p-phenylphenol, o-chlorophenol, m-chlorophenol, p-chlorophenol, o-fluorophenol, m-fluorophenol, p-fluorophenol, o-iodophenol, m-iodophenol, p-iodophenol, o-bromophenol, m-bromophenol, p-bromophenol, o-dihydroxybenzene, m-dihydroxybenzene, p-dihydroxybenzene, and others. These phenols may be used alone or in combination of two or more.

The phenol-aralkyl resin is obtained by reacting a phenolic compound and an aralkyl compound that is an aralkyl halide, an aralkyl alcohol, or a derivative thereof. The phenolic compound used here includes compounds similar to those for the above phenol-dicyclopentadiene resin. The aralkyl compound to be reacted with the phenolic compound includes α,α'-dihalogenoxylenes such as α,α'-dichloro-p-xylene, α,α'-dichloro-m-xylene, α,α'-dichloro-o-xylene, α,α'-dibromo-p-xylene, α,α'-dibromo-m-xylene, and α,α'-dibromo-o-xylene; xylylene glycols such as α,α'-dihydroxy-p-xylene, α,α'-dihydroxy-m-xylene, and α,α'-dihydroxy-o-xylene; and α,α'-dialkoxyxylenes such as α,α'-dimethoxy-p-xylene, α,α'-dimethoxy-m-xylene, α,α'-dimethoxy-o-xylene, α,α'-diethoxy-p-xylene, α,α'-diethoxy-m-xylene, α,α'-diethoxy-o-xylene, α,α'-dipropoxy-p-xylene, α,α'-dipropoxy-m-xylene, α,α'-dipropoxy-o-xylene, α,α'-diisopropoxy-p-xylene, α,α'-diisopropoxy-m-xylene, α,α'-diisopropoxy-o-xylene, α,α'-di-tert-butoxy-p-xylene, α,α'-di-tert-butoxy-m-xylene, α,α'-di-tert-butoxy-o-xylene, α,α'-di-n-butoxy-p-xylene, α,α'-di-n-butoxy-m-xylene, and α,α'-di-n-butoxy-o-xylene; and others. These aralkyl compounds may be used alone or in combination of two or more.

The phenol-biphenylaralkyl resin is obtained by reacting a phenolic compound and a biphenylaralkyl compound that is a biphenylaralkyl halide or its derivative. The phenolic compound used here includes compounds similar to those for the above phenol-dicyclopentadiene resin. The biphenylaralkyl compound to be reacted with the phenolic compound includes, but is not limited to, di(halogenomethyl)biphenyls such as 2,2'-bis(chloromethyl)biphenyl, 2,3'-bis(chloromethyl)biphenyl, 2,4'-bis(chloromethyl)biphenyl, 3,3'-bis(chloromethyl)biphenyl, 3,4'-bis(chloromethyl)biphenyl, 4,4'-bis(chloromethyl)biphenyl, 2,2'-bis(bromomethyl)biphenyl, 2,3'-bis(bromomethyl)biphenyl, 2,4'-bis(bromomethyl)biphenyl, 3,3'-bis(bromomethyl)biphenyl, 3,4'-bis(bromomethyl)biphenyl, and 4,4'-bis(bromomethyl)biphenyl, and others. These biphenylaralkyl compounds may be used alone or in combination of two or more.

The naphthol-aralkyl resin is obtained by reacting α-naphthol or β-naphthol with an aralkyl halide, aralkyl alcohol, or derivative thereof described in the preparation of the phenol-aralkyls.

As the compound to be reacted with the phenolic resin that is an alternate copolymer of a phenolic compound and a compound having a divalent connecting group, preferred examples are compounds represented by general formula (6-1).

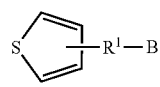

(6-1)

(In the formula, $R^1$ represents a $C_{1-8}$ linear, branched, or cyclic hydrocarbon group; and B represents a hydroxyl group or halogen atom.)

The hydrocarbon group $R^1$ in the compound represented by general formula (6-1) includes, specifically, methylene, ethylene, trimethylene, tetramethylene, pentamethylene, hexamethylene, heptamethylene, octamethylene, ethylethylene, 2-methyltetramethylene, 2-methylhexamethylene, 2-ethylhexamethylene, 1,3-cyclobutylene, 1,3-cyclopentylene, 1,4-cyclohexylene, 1,4-cyclo-octylene, vinylene, propenylene, butanediylidene, 1-propanyl-3-ylidene, o-phenylene, m-phenylene, p-phenylene, 3-cyclohexen-1,2-ylene, and 2,5-cyclohexadien-1,4-ylene, and others. Among these, methylene and ethylene are particularly preferable.

B is a hydroxyl group or halogen atom. Among halogen atoms, chlorine atom is particularly preferable.

The compound represented by general formula (6-1) includes, specifically, 2-thiophenemethanol, 3-thiophenemethanol, 2-thiopheneethanol, 3-thiopheneethanol, 2-thiophenepropanol, 3-thiophenepropanol, 2-thiophehebutanol, 3-thiophenebutanol, 2-thiophenepentanol, 3-thiophenepentanol, 2-thiophenehexanol, 3-thiophenehexanol, 2-thiopheneheptanol, 3-thiopheneheptanol, 2-thiopheneoctanol, 3-thiopheneoctanol, 2-thiophenecyclopropanol, 3-thiophenecyclopropanol, 2-thiophenecyclobutanol, 3-thiophenecyclobutanol, 2-thiophenecyclopentanol, 3-thiophenecyclopentanol, 2-thiophenecyclohexanol, 3-thiophenecyclohexanol, 2-thiophenecycloheptanol, 3-thiophenecycloheptanol, 2-thiophenecyclooctanol, 3-thiophenecyclooctanol, 1-(2-thienyl)-2-propanol, 1-(3-thienyl)-2-propanol, 1-(2-thienyl)-2-ethyl-1-hexanol, 1-(3-thienyl)-2-ethyl-1-hexanol, α-cyclopropyl-2-thiophenemethanol, α-cyclopropyl-3-thiophenemethanol, 2-(chloromethyl)thiophene, 3-(chloromethyl)thiophene, 2-(chloroethyl)thiophene, 3-(chloroethyl)thiophene, 2-(bromomethyl)thiophene, 3-(bromomethyl)thiophene, 2-(bromoethyl)thiophene, 3-(bromoethyl)thiophene, 2-(fluoromethyl)thiophene, 3-(fluoromethyl)thiophene, 2-(fluoroethyl)thiophene, 3-(fluoroethyl)thiophene, 2-(iodomethyl)thiophene, 3-(iodomethyl)thiophene, 2-(iodoethyl)thiophene, 3-(iodoethyl)thiophene, and others. These compounds may be used alone or in combination of two or more. Particularly, 2-thiophenemethanol, (3-thienyl)ethanol, 2-(chloromethyl)thiophene, 3-(chloromethyl)thiophene, 2-(bromomethyl)thiophene, 3-(bromomethyl)thiophene, 2-(fluoromethyl)thiophene, 3-(fluoromethyl)thiophene, 2-(iodomethyl)thiophene, and 3-(iodomethyl)thiophene are preferable in view of flame retardancy.

Hereinafter, the method for producing the modified phenolic resin of the present invention will be explained more specifically.

Firstly, the phenolic resin represented by general formula (5-1) or (7-1) and the compound represented by general formula (6-1) as source materials, an acid catalyst, and optionally a solvent are charged in a reactor. The compound of general formula (6-1) may be charged as a solution or in a neat state without dissolving in any solvent. This reaction solution is stirred for a predetermined period of time while the temperature is regulated at a predetermined value and the water and the halide generated by the reaction are distilled off so as to allow the reaction to proceed. After the predetermined reaction time, the solid catalyst, if used, is removed by filtration or otherwise. The modified phenolic resin of the present invention may be obtained by removing the solvent and unreacted compound represented by general formula (6-1) remained by vacuum distillation or the like or by precipitating the polymer.

The ratio of the compound represented by general formula (6-1) and the phenolic resin represented by general formula (5-1) or (7-1) charged as the source materials is such that the equivalent of compound represented by general formula (6-1) is 10 millimoles to 6 moles, preferably 50 millimoles to 4 moles, and more preferably 100 millimoles to 2 moles per mole of hydroxyl groups in the phenolic resin.

The acid catalyst used in the present invention includes inorganic acids such as hydrochloric acid, sulfuric acid, and phosphoric acid; organic acids such as acetic acid, oxalic acid, trifluoroacetic acid, p-toluenesulfonic acid, and diethyl sulfate; Lewis acids such as zinc chloride, aluminum chloride, iron chloride, and boron trifluoride; solid acid catalysts such as zeolite, montmorillonite, and activated clay; superacids such as trifluoromethanesulfonic acid; acidic ion-exchange resin such as alkanesulfonic acid-type resin; superacid ion-exchange resins such as perfluoroalkanesulfonic acid-type resin. These may be used alone or in combination of two or more. Among these, p-toluenesulfonic acid and diethyl sulfate are preferable.

The amount of the acid catalyst to be used relative to the total mass of the phenolic resin, the compound represented by general formula (6-1), and the acid catalyst is 0.0001 mass % to 10 mass %, preferably 0.001 mass % to 5 mass %, and more preferably 0.01 mass % to 1 mass % for liquid of inorganic acids, organic acids, and others; and 1 mass % to 100 mass %, and preferably 10 mass % to 50 mass % for solid acid catalysts and solid ion-exchange resins.

The solvent may be used if necessary. Any solvent may be used as long as the objective of the present invention is not impaired. Specific examples thereof include aromatic hydrocarbon solvents such as benzene, toluene, xylene, ethylbenzene, mesithylene, and anisole; halohydrocarbon solvents such as dichloromethane, 1,2-dichloroethane, and 1,1,2-trichloroethane; hydrocarbon solvents such as hexane, heptane, octane, and cyclohexane; and ester solvents such as ethyl acetate, butyl acetate, and amyl acetate. The amount of solvent to be used is arbitrary, but desirably 20 ml or less, preferably 10 ml or less, and more preferably 5 ml or less, per gram of the source phenolic resin from the viewpoint of volume efficiency and economic efficiency.

The reaction may be performed under either in air or an atmosphere of inert gas such as nitrogen, argon, and helium. Nitrogen atmosphere is particularly preferred in view of cost performance for preventing the phenol from oxidation.

The reaction temperature is 40 to 250° C., preferably 60 to 200° C., and more preferably 80 to 160° C. The reaction may be performed under any of reduced, normal, and positive pressures. When the reaction temperature exceeds the boiling point of the solvent, it is desirable to conduct the reaction under positive pressure using a pressure-resistant reactor. The reaction time is in the range of 1 to 25 hours depending on the reaction temperature and other conditions. In practice, it is desirable to determine the termination of the reaction while monitoring consumption of the compound represented by general formula (6-1) with high performance liquid chromatography, gas chromatography, or the like.

[Epoxy Resin Composition]

The epoxy resin composition using the modified phenolic resin of the present invention as a hardener will be explained.

The epoxy resin composition of the present invention comprises the modified phenolic resin represent by general formula (2-1) or general formula (3-1) as an essential component of hardener (B), bi- or poly-functional epoxy compound or bi- or poly-functional epoxy resin (A), and curing accelerator (C).

[Bi- or Poly-Functional Epoxy Compound or Bi- or Poly-Functional Epoxy Resin (A)]

In the epoxy resin composition used in the present invention, bi- or poly-functional epoxy compound or bi- or poly-functional epoxy resin (A) includes any substance having two or more epoxy groups per molecule, and such substances have epoxy groups introduced by olefin oxidation, glycidyl etherification of hydroxyl groups, N-glycidylation of primary or secondary amines, glycidyl esterification of carboxylic acids, or otherwise.

Specifically, there may be mentioned epoxidized derivatives of hydroxybenzenes such as catechol, resorcin, and hydroquinone; 2,6-dihydroxynaphthalene; bisphenols such as 2,2-bis(4-hydroxyphenyl)propane (bisphenol A), 2-(3-hydroxyphenyl)-2-(4'-hydroxyphenyl)propane, bis(4-hydroxyphenyl)methane (bisphenol F), bis(4-hydroxyphenyl)sulfone (bisphenol S), bis(4-hydroxyphenyl)sulfide, bis(4-hydroxyphenyl)methylcyclohexane, bis(4-hydroxyphenyl) methylbenzene, 4,4'-dihydroxybiphenyl, 4,4'-dihydroxy-2, 2'6,6'-tetramethylbiphenyl, 4,4'-dihydroxydiphenyl ether, 6,6'-dihydroxy-3,3,3',3'-tetramethyl-1,1'-spiroindane, and 1,3,3-trimethyl-1-(4-hydroxyphenyl)-1-indan-6-ol; oligophenols such as tetraphenylolethane and naphthol-cresol resol condensate; phenol-novolacs, residues after removing bisphenols from novolac (triphenols and higher polyphenols, hereinafter abbreviated as VR); phenolic resins such as phenol-dicyclopentadiene resin, phenol-aralkyl resin, biphenyl-aralkyl resin, and naphthol-aralkyl resin; aliphatic or aromatic amines such as ethylenediamine, propylenediamine, hexamethylenediamine, aniline, 4,4'-diaminodiphenyl-methane (MDA), 4,4'-diaminodiphenyl ether, 4,4'-diamino-diphenyl sulfone, 2,2-bis(4,4'-aminophenyl)propane, m-xylylenediamine, p-xylylenediamine, 1,2-diaminocyclohexane, and aniline-aralkyl resin represented by general formula (8-1) (trade name: Anilix; manufactured by Mitsui Chemicals, Inc.); aminophenols such as m-aminophenol, p-aminophenol, 2-(4-aminophenyl)-2-(4'-hydroxyphenyl)propane, and 4-aminophenyl(4'-hydroxyphenyl)methane; phthalic acid, isophthalic acid, terephthalic acid, tetrahydrophthalic acid, hexahydrophthalic acid, and dimer acid; hydroxycarboxylic acids such as 1,3-hydroxybenzoic acid; and others.

(8-1)

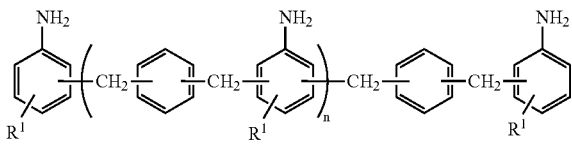

(In the formula, $R^1$ represents a hydrogen atom or $C_{1-9}$ linear, branched, or cyclic alkyl group; the recurring unit number, n, represents an integer of 0 to 50; and the average of n is in the range of 0 to 15.)

Glycidylation of these active hydrogen-containing compounds can be performed by known methods, among which the most common is treating with epichlorohydrin in the presence of a hydrogen halide acceptor. It is also known that glycidyl esterification is preferably performed by reacting a methyl carboxylate and glycidol using a metal catalyst, particularly a thallium compound such as $TlNO_3$ and $Tl(OCOCF_3)_3$.

These bi- or poly-functional epoxy compounds or bi- or poly-functional epoxy resins may be used alone or in combination of two or more.

[Hardener (B)]

The epoxy resin composition used in the present invention is characterized in that the modified phenolic resin of the present invention, which may be used alone or in combination of two or more, is used as an essential component of hardener (B). The modified phenolic resin used as hardener (B) is blended in such an amount that the hydroxyl equivalent of hardener (B) becomes preferably 0.5 to 1.2 equivalents and more preferably 0.75 to 1.1 equivalents relative to 1 epoxy equivalent of the epoxy resin.

In the present invention, blending the above ratio of the modified phenolic resin as hardener (B) is preferred since the cured products obtained are excellent in both flame retardancy and adhesion.

[Curing Accelerator (C)]

As curing accelerator (C) used in the present invention, any compound may be used without particular limitation as long as it accelerates curing reaction between the epoxy resins and the phenolic compounds or resins. Curing accelerators used here include phosphines such as tributylphosphine, triphenylphosphine, tris(dimethoxyphenyl)phosphine, tris(hydroxypropyl)phosphine, tris(cyanoethyl)phosphine, tris(trimethoxyphenyl)phosphine, tris(dimethoxyphenyl)phosphine, tris(trimethylphenyl)phosphine, and tris(dimethylphenyl)phosphine; phosphonium salts such as tetraphenylphosphonium tetraphenylborate, methyltributylphosphonium tetraphenylborate, and methyltri(cyanoethyl)phosphonium tetraphenylborate; imdazoles such as 2-methylimidazole, 2-phenylimidazole, 2-ethyl-4-methylimidazole, 2-undecylimidazole, 1-cyanoethyl-2-methylimidazole, 2,4-dicyano-6-(2-methylimidazolyl-(1)) ethyl-s-triazine, and 2,4-dicyano-6-(2-undecylimidazolyl-(1))ethyl-s-triazine; imidazolium salts such as 1-cyanoethyl-2-undecylimidazolium trimellitate, 2-methylimidazolium isocyanurate, 2-ethyl-4-methylimidazolium tetraphenylborate, and 2-ethyl-1,4-dimethylimidazolium tetraphenylborate; pyridines such as N,N'-dimethylaminopyridine; amines such as 2,4,6-tris(dimethylaminomethyl)phenol, benzylmethylamine, tetramethylbutylguanidine, N-methylpiperazine, and 2-dimethylamino-1-pyrroline; ammonium salts such as triethylammonium tetraphenylborate; diazabicyclo compounds such as 1,5-diazabicyclo[5.4.0]-7-undecene, 1,5-diazabicyclo[4.3.0]-5-nonene, and 1,4-diazabicyclo[2.2.2]octane; and tetraphenylborates, phenolates, phenol-novolac salts, and 2-ethylhexanoates of these diazabicyclo compounds; and others.

Curing accelerator (C), which may be a single compound or a mixture of two or more, is used in an amount of 0.1 to 7 mass %, and preferably 0.5 to 3 mass % relative to the total mass of bi- or poly-functional epoxy compound or bi- or poly-functional epoxy resin (A) and hardener (B).

[Organic and/or Inorganic Filler (D)]

The epoxy resin composition of the present invention optionally contains organic and/or inorganic filler (D) and other additives. In particular, when used as a sealing material for semiconductor integrated circuits, it is desirable to use organic and/or inorganic filler for improving mechanical properties and reducing the total cost; a colorant such as carbon black for preventing malfunction caused by light exposure; and further a releasing agent, a coupling agent, a flame retardant, a plasticizer, a reactive diluent, a pigment and others.

The amount of organic and/or inorganic filler (D) to be used is 100 to 1900 parts by mass, preferably 250 to 1900 parts by mass, and more preferably 550 to 1900 parts by mass, relative to 100 parts by mass of the total of bi- or poly-functional epoxy compound or bi- or poly-functional epoxy resin (A) and hardener (B).

The organic and/or inorganic filler used here includes powders of silica, alumina, silicon nitride, silicon carbide, talc, calcium silicate, calcium carbonate, mica, clay, titanium white, and others; fibers such as glass fibers, carbon fibers, and aramid fibers; and others. Among these, crystalline silica and/or fused silica are suitable for the sealing material. Further, considering the fluidity in molding the resin composition, the shape of silica is preferably spherical or a mixture of spherical and pulverized.

In terms of the mechanical strength and heat resistance, it is preferred to blend various additives. For example, a coupling agent is preferably used to improve adhesion between the resin and inorganic filler. Such coupling agents include silane-, titanate-, aluminate-, and zircoaluminate-type coupling agents and others. Among these, preferred are silane coupling agents, particularly silane coupling agents having a functional group reactive to epoxy groups.

Such coupling agents include vinyltrimethoxysilane, vinyltriethoxysilane, N-(2-aminomethyl)-3-aminopropylmethyldimethoxysilane, N-(2-aminoethyl)-3-aminopropyltrimethoxysilane, 3-aminopropyltriethoxysilane, 3-anilinopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-methacryloxypropyltrimethoxysilane, 3-mercaptopropyltrimethoxysilane, and others. These may be used alone or in combination of two or more. It is desirable that these coupling agents are pre-immobilized on surfaces of the inorganic filler by adsorption or reaction.

[Epoxy Resin-Cured Product]

The cured epoxy resin of the present invention is obtained by thermal-curing the above epoxy resin composition of the present invention. The curing temperature is 100° C. to 220° C., and preferably 150° C. to 200° C. The curing time is 1 minute to 20 hours, and preferably 1 hour to 10 hours.

Thermal-curing of the epoxy resin composition of the present invention provides the cured epoxy resin of the present invention, which has excellent adhesion and flame retardancy.

[Semiconductor Device]

The semiconductor device of the present invention is obtained by sealing a semiconductor integrated circuit with the epoxy resin composition of the present invention. Low-pressure transfer molding is the most popular for producing semiconductor devices, but there are applicable other methods such as injection molding, compression molding, and cast molding. A special method using a solvent is also applicable.

Hereinafter, the prepreg according to the present invention, the laminate formed by stacking the prepregs, and the electronic circuit board using the laminate will be specifically explained.

The epoxy resin composition used in the prepreg of the present invention contains bi- or poly-functional epoxy compound or bi- or poly-functional epoxy resin (A), hardener (B), and curing accelerator (C) below.

[Bi- or Poly-Functional Epoxy Compound or Bi- or Poly-Functional Epoxy Resin (A)]

Bi- or poly-functional epoxy compound or bi- or poly-functional epoxy resin (A) used in the present invention includes any substances having two or more epoxy groups per molecule, in which epoxy groups are introduced by olefin oxidation, glycidyl etherification of hydroxyl groups, N-glycidylation of primary or secondary amines, glycidyl esterification of carboxylic acids, or otherwise.

i) Source Material for Epoxy Compound or Epoxy Resin:

Specific examples of hydroxyl group-containing compound used for the glycidyl etherification include dihydroxybenzenes such as catechol, resorcin, and hydroquinone; 2,6-dihydroxynaphthalene; bisphenols such as 2,2-bis(4-hydroxyphenyl)propane (bisphenol A), 2-(3-hydroxyphenyl)-2-(4'-hydroxyphenyl)propane, bis(4-hydroxyphenyl)methane (bisphenol F), bis(4-hydroxyphenyl)sulfone (bisphenol S), bis(4-hydroxyphenyl) sulfide, bis(4-hydroxyphenyl)methylcyclohexane, bis(4-hydroxyphenyl)methylbenzene, 4,4'-dihydroxybiphenyl, 4,4'-dihydroxy-2,2'6,6'-tetramethylbiphenyl, 4,4'-dihydroxydiphenyl ether, 6,6'-dihydroxy-3,3,3',3'-tetramethyl-1, 1'-spiroindane, and 1,3,3-trimethyl-1-(4-hydroxyphenyl)-1-indane-6-ol; oligo-phenols such as tetraphenylolethane and naphthol-cresol resol condensate; phenol-novolacs, residues after removing bisphenols from novolacs; phenolic resins such as phenol-dicyclopentadiene resins, phenol-aralkyl resins, biphenylaralkyl resins, and naphthol-aralkyl resins; and others. Particularly preferred are bisphenols such as 4,4'-dihydroxybiphenyl and 4,4'-dihydroxy-2,2'6,6'-tetramethylbiphenyl; and phenolic resins such as phenol-novolacs, phenol-dicyclopentadiene resins, phenol-aralkyl resins, biphenylaralkyl resins, and naphthol-aralkyl resins.

Specific examples of primary or secondary amines used for the N-glycidylation include aliphatic or aromatic amines such as ethylenediamine, propylenediamine, hexamethylenediamine, aniline, 4,4'-diaminodiphenylmethane (MDA), 4,4'-diaminodiphenyl ether, 4,4'-diaminodiphenyl sulfone, 2,2-bis(4,4'-diaminophenyl)propane, m-xylylenediamine, p-xylylenediamine, 1,2-diaminocyclohexane, and aniline-aralkyl resin represented by general formula (8-1) above (trade name: Anilix; manufactured by Mitsui Chemicals, Inc.); aminophenols such as m-aminophenol, p-aminophenol, 2-(4-aminophenyl)-2-(4'-hydroxyphenyl)propane, and 4-aminophenyl-(4'-hydroxyphenyl)methane; and others. Particularly preferred are aniline-aralkyl resins represented by general formula (8-1), among which most preferred are compounds or polymers with recurring unit number, n, of 0 to and mixtures thereof.

Specific examples of carboxylic group-containing compounds used for the glycidyl esterification includes phthalic acid, isophthalic acid, terephthalic acid, tetrahydrophthalic acid, hexahydrophthalic acid, dimer acid, epoxidized hydroxycarboxylic acids such as 1,3-hydroxybenzoic acid, and others.

ii) Production Method of Epoxy Compound or Epoxy Resin

Glycidylation of the above compounds having active hydrogens such as hydroxyl group, amino group, and carboxyl group can be preformed by conventional methods, among which the most common is treating with epichlorohydrin in the presence of a hydrogen halide acceptor. It is also known that glycidyl esters are preferably produced by reacting methyl carboxylates and glycidol using a metal catalyst, particularly, a thallium compound such as $TlNO_3$ and $Tl(O-COCF_3)_3$.

The bi- or poly-functional epoxy compounds or bi- or poly-functional epoxy resins obtained from the above compounds may be used alone or in combination of two or more. Further, the epoxy compound and epoxy resin may be used in combination in any ratio.

[Hardener (B)]

Hardener (B) used in the present invention includes the modified phenolic resin which is a phenolic resin that is an alternate copolymer of at least one phenolic compound selected from phenol, naphthols, and their derivatives, and a compound having a divalent connecting group, in which a side chain of an aromatic ring having a hydroxyl group is substituted with a group represented by general formula (1-1) above.

More preferably, hardener (B) is the modified phenolic resin which is a phenolic resin that is an alternate copolymer of at least one phenolic compound selected from phenol, naphthols, and their derivatives, and a compound having a divalent connecting group, in which a side chain of an aromatic ring having a hydroxyl group is substituted with a group represented by the following general formula (1-2).

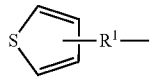
(1-2)

(In the formula, $R^1$ represents a $C_{1-3}$ alkylene, 1,4-cyclohexylene, or phenylene group.)

Hereinafter, specific description will be given on the modified phenolic resin having the group represented by general formula (1-2) used as hardener (B).

i) Source Material of (Unmodified) Phenolic Resin

Specific examples of usable phenolic compounds include phenol, o-cresol, m-cresol, p-cresol, o-ethylphenol, m-ethylphenol, p-ethylphenol, p-n-propylphenol, p-isopropylphenol, 2,4-xylenol, 2,6-xylenol, 4,6-xylenol, 3,5-xylenol, 2,4,6-trimethylphenol, o-phenylphenol, m-phenylphenol, p-phenylphenol, o-chlorophenol, m-chlorophenol, p-chlorophenol, o-fluorophenol, m-fluorophenol, p-fluorophenol, o-dihydroxybenzene, m-dihydroxybenzene, p-dihydroxybenzene, o-methoxyphenol, m-methoxyphenol, p-methoxyphenol, o-ethoxyphenol, m-ethoxyphenol, p-ethoxyphenol, p-propoxyphenol, α-naphthol, β-naphthol, and others, which may be used alone or in combination of two or more. Among these, preferred are phenol, o-cresol, m-cresol, p-cresol, α-naphthol, and β-naphthol. Especially preferred are phenol and α-naphthol.

ii) Source Material Forming Connecting Group A

Connecting group A includes methylene, ethylene, propylene, isopropylene, 1,3-cyclopentylene, 1,4-cyclohexylene, 1,4-cyclo-octylene, o-phenylene, m-phenylene, p-phenylene, 1,2-xylylene, 1,3-xylylene, 1,4-xylylene, 1,2-xylylenebiphenyl, 1,3-xylylenebiphenyl, 1,4-xylylenebiphenyl, and groups represented by general formula (4-1) above. Above all, preferred are methylene, 1,2-xylylene, 1,3-xylylene, 1,4-xylylene, 1,2-xylylenebiphenyl, 1,3-xylylenebiphenyl, 1,4-xylylenebiphenyl, and groups represented by general formula (4-1); and especially preferred are methylene, ethylene, m-phenylene, p-phenylene, 1,3-xylylenebiphenyl, 1,4-xylylenebiphenyl, and groups represented by general formula (4-1). These connecting groups A provide excellent adhesion and flame retardancy, which are effects of the present invention.

Specific examples of the source material forming connecting group A include:
1) for phenol-novolac resins, formaldehyde, 2) for phenol-dicyclopentadiene resins, dicyclopentadiene, 3) for phenol-aralkyl resins, aralkyl compounds including α,α'-dihaloxylenes such as α,α'-dichloro-p-xylene, α,α'-dichloro-m-xylene, α,α'-dichloro-o-xylene, α,α'-dibromo-p-xylene, α,α'-dibromo-m-xylene, and α,α'-dibromo-o-xylene; xylylene glycols such as α,α'-dihydroxy-p-xylene, α,α'-dihydroxy-m-xylene, and α,α'-dihydroxy-o-xylene; and α,α'-dialkoxyxylenes such as α,α'-dimethoxy-p-xylene, α,α'-dimethoxy-m-xylene, α,α'-dimethoxy-o-xylene, α,α'-diethoxy-p-xylene, α,α'-diethoxy-m-xylene, α,α'-diethoxy-o-xylene, α,α'-dipropoxy-p-xylene, α,α'-dipropoxy-m-xylene, α,α'-dipropoxy-o-xylene, α,α'-di-isopropoxy-p-xylene, α,α'-di-isopropoxy-m-xylene, α,α'-di-isopropoxy-o-xylene, α,α'-di-tert-butoxy-p-xylene, α,α'-di-tert-butoxy-m-xylene, α,α'-di-tert-butoxy-o-xylene, α,α'-di-n-butoxy-p-xylene, α,α'-di-n-butoxy-m-xylene, and α,α'-di-n-butoxy-o-xylene; and others, 4) for phenol-biphenylaralkyl resins, biphenylaralkyl halides or biphenylaralkyl compounds derived therefrom including di(halomethyl)biphenyls such as 2,2'-bis(chloromethyl)biphenyl, 2,3'-bis(chloromethyl)biphenyl, 2,4'-bis(chloromethyl)biphenyl, 3,3'-bis(chloromethyl)biphenyl, 3,4'-bis(chloromethyl)biphenyl, 4,4'-bis(chloromethyl)biphenyl, 2,2'-bis(bromomethyl)biphenyl, 2,3'-bis(bromomethyl)biphenyl, 2,4'-bis(bromomethyl)biphenyl, 3,3'-bis(bromomethyl)biphenyl, 3,4'-bis(bromomethyl)biphenyl, and 4,4'-bis(bromomethyl)biphenyl; and others, and 5) for naphthol-aralkyl resins, any of the source materials described in 1) to 4).

Preferred source materials includes: 1) for phenol-novolac resins, formaldehyde, 2) for phenol-dicylopentadiene resins, dicyclopentadiene, 3) for phenol-aralkyl resins, α,α'-dichloro-p-xylene and α,α'-dichloro-m-xylene, 4) for phenol-biphenylaralkyl resins, 3,3'-bis(chloromethyl)biphenyl and 4,4'-bis(chloromethyl)biphenyl, and 5) for naphthol-aralkyl resins, formaldehyde, dicyclopentadiene, α,α'-dichloro-p-xylene, 3,3'-bis(chloromethyl)biphenyl, and 4,4'-bis(chloromethyl)biphenyl.

These source materials may be used alone or in combination with two or more aralkyl compounds for any resins.

iii) Production Method of Phenolic Resin

Condensation of the above phenolic compound and the source material forming divalent connecting group A gives the alternate copolymer, that is, the phenolic resin. The production method is not particularly limited, and any known methods can be applied. Specifically, the phenol, connecting compound, and acid catalyst are charged, and the reaction is conducted for several hours while the temperature is kept at 80° C. to 150° C. to obtain a crude phenolic resin, from which the phenol remained is removed at 150° C. or higher temperatures under reduced pressure to obtain a purified phenolic resin.

iv) Source Material of Side-Chains of Modified Phenolic Resin

Specific examples of $R^1$, which is the divalent group in general formula (1-2), include methylene, ethylene, propylene, isopropylene, 1,4-cyclohexylene, and phenylene. Methylene and ethylene are preferred.

As the source compound for introducing the mono-valent group represented by general formula (1-2) as a side-chain, specific examples include 2-thiophenemethanol, 3-thiophenemethanol, 2-thiopheneethanol, 3-thiopheneethanol, 2-thiophenepropanol, 3-thiophenepropanol, 2-thiophenecyclohexanol, 3-thiophenecyclohexanol, 2-thiophenecyclooctanol, 3-thiophenecyclooctanol, 1-(2-thienyl)-2-propanol, 1-(3-thienyl)-2-propanol, 2-(chloromethyl)thiophene, 3-(chloromethyl)thiophene, 2-(chloroethyl)thiophene, 3-(chloroethyl)thiophene, 2-(bromomethyl)thiophene, 3-(bromomethyl)thiophene, 2-(bromoethyl)thiophene, 3-(bromoethyl)thiophene, 2-(fluoromethyl)thiophene, 3-(fluoromethyl)thiophene, 2-(fluoroethyl)thiophene, 3-(fluoroethyl)thiophene, 2-(iodomethyl)thiophene, 3-(iodomethyl)thiophene, 2-(iodoethyl)thiophene, 3-(iodoethyl)thiophene, (2-thienyl)phenol, (3-thienyl)phenol, (2-thienyl)chlorobenzene, (3-thienyl)chlorobenzene, (2-thienyl)bromobenzene, (3-thienyl)bromobenzene, and others.

These compounds may be used alone or in combination of two or more. In view of flame retardancy, particularly preferred are 2-thiophenemethanol, 3-thiophenemethanol, 2-(chloromethyl)thiophene, 3-(chloromethyl)thiophene, 2-(bromomethyl)thiophene, 3-(bromomethyl)thiophene, 2-(fluoromethyl)thiophene, 3-(fluoromethyl)thiophene, 2-(iodomethyl)thiophene, and 3-(iodomethyl)thiophene.

v) Method for Modifying Phenolic Resin

There is no particular limitation on the method for introducing the mono-valent group represented by general formula (1-2) as the side-chain in the phenolic resin via reaction of the unmodified phenolic resin with the source compound providing the group represented by general formula (1-2), particularly the compound represented by general formula (6-1), that is, the method for modifying the phenolic resin. Any known methods may be applied.

Specifically, the phenolic resin and the source compound providing the group represented by general formula (1-2) are reacted in the presence of an acid catalyst, optionally using a solvent, in a solution or suspension (heterogeneous system), while the water and the halide generated by the reaction are distilled off. The reaction atmosphere is preferably in the air or an inert gas such as nitrogen, argon, and helium. The reaction temperature is 40° C. to 250° C., preferably 60° C. to 200° C., and more preferably 80° C. to 160° C. As for the reaction time, in practice, it is desirable to judge the termination by monitoring the reaction with high performance liquid chromatography, gas chromatography, or otherwise. The reaction time is generally in the range of 1 to 25 hours.

The phenolic resin and the source compound providing the group represented by general formula (1-2) are charged in a ratio of 10 millimoles to 6 moles, preferably 50 millimoles to 4 moles, and more preferably 100 millimoles to 2 moles per mole of hydroxyl groups in the phenolic resin.

The acid catalyst used here includes inorganic acids such as hydrochloric acid, sulfuric acid, and phosphoric acid; organic acids such as acetic acid, oxalic acid, trifluoroacetic acid, p-toluenesulfonic acid, and diethyl sulfate; Lewis acids such as zinc chloride, aluminum chloride, iron chloride, and boron trifluoride; solid acid catalysts such as zeolite, montmorillonite, and activated clay; superacids such as trifluoromethanesulfonic acid; acidic ion-exchange resins such as alkanesulfonic acid type-resins; superacid ion-exchange resins such as perfluoroalkanesulfonic acid type-resins. These acid catalysts may be used alone or in combination of two or more. Among these, p-toluenesulfonic acid and diethyl sulfate are preferable.

The amount of the acid catalyst to be used is 0.0001 to 10 mass %, preferably 0.001 to 5 mass %, and more preferably 0.01 to 1 mass % for liquid of inorganic acids, organic acids, and the like; and 1 to 100 mass %, and preferably 10 to 50 mass % for solid acid catalysts and solid ion-exchange resins in the total of the phenolic resin, the compounds represented by general formula (6-1) and the acid catalyst.

vi) Properties of Modified Phenolic Resin

By introducing the mono-valent group represented by general formula (1-2) into the phenolic resin as the side-chain, the modified phenolic resin exhibits excellent heat resistance, flame retardancy, and adhesion characteristic of the present invention. In addition, the mechanical properties such as flexural strength and flexural modulus and moisture absorption of the unmodified phenolic resin are not impaired, and comparable performances can be attained.

If the sulfur atom content is 0.01 moles or less per mole of hydroxyl groups in the modified phenolic resin, performances of the present invention are not attained in heat resistance, flame retardancy, and adhesion. With 2 moles or more of sulfur atom per mole of hydroxyl groups, there occur problems such as significant lowering of the curing speed and lowering of the productivity due to prolonged time for modifying the phenolic resin.

The hydroxyl group content in the modified phenolic resin of the present invention can be estimated as follows: after the resin is acetylated with acetic anhydride in a solvent such as pyridine, for example, the excess reagent is hydrolyzed to yield acetic acid, which is titrated with a potassium hydroxide solution. The sulfur atom content can be estimated by NMR measurement in chloroform or otherwise. In order to obtain adequate heat resistance, flame retardancy, and adhesion, the hydroxyl equivalent of the modified phenolic resin is 101 to 440 g/eq, preferably 105 to 400 g/eq, and more preferably 110 to 350 g/eq.

vii) Specific Example of Modified Phenolic Resin

The modified phenolic resin is preferably represented by general formula (2-2) or (3-2) above. In general formula (2-2) or (3-2), the monovalent group or atom $R^2$ includes, specifically, hydrogen atom, methyl, ethyl, propyl, isopropyl, methoxy, ethoxy, propoxy, isopropoxy, phenyl, fluorine atom, chlorine atom, hydroxyl, and others. Among these, hydrogen atom, hydroxyl, methyl, and methoxy are particularly preferred. The monovalent group or atom $R^2$ is determined by the structure of the phenolic compound used as the source material of the phenolic resin.

In general formula (2-2), each of x and z is an integer of 0 to 4, preferably an integer of 0 to 2, and more preferably an integer of 0 to 1; y is an integer of 0 to 3, preferably an integer of 0 to 2, and more preferably an integer of 0 to 1; the sum of x, y, and z is an integer of 1 to 11, preferably an integer of 1 to 5, and more preferably an integer of 1 to 3; and the recurring unit number, n, is an integer of 0 to 50, more preferably 0 to 15, and particularly preferably an integer of 2 to 10.

In general formula (3-2), each of x and z is an integer of 0 to 6, preferably an integer of 0 to 3, and more preferably an integer of 0 to 1; y is an integer of 0 to 5, preferably an integer of 0 to 2, and more preferably an integer of 0 to 1; the sum of x, y, and z is an integer of 1 to 17, preferably an integer of 1 to 10, and more preferably an integer of 1 to 3; and the recurring unit number, n, is an integer of 0 to 50, and preferably 0 to 15. Most preferably, the resin is a compound, polymer, or mixture thereof with n varied in a certain range.

In general formula (2-2) or (3-2), the recurring unit number, n, is an integer of preferably 0 to 50, and more preferably an integer of 0 to 15, particularly preferably an integer of 2 to 10. Most preferably, the resin is a compound, polymer, or mixture thereof with n varied in a certain range.

Preferred specific examples represented by general formula (2-2) or general formula (3-2) include the twenty modified phenolic resins represented by general formulae (1) to (20) above.

viii) Amount of Hardener (B) Used

The amount of the modified phenolic resin to be used as hardener (B) is preferably 2 to 150 parts by weight, more preferably 20 to 140 parts by weight, particularly preferably 40 to 130 parts by weight, and most preferably 70 to 120 parts by weight, relative to 100 parts by weight of bi- or poly-functional epoxy compound or bi- or poly-functional epoxy resin (A). If hardener (B) is used in an amount less than 2 parts by weight, flame retardancy is lowered due to increase in the ratio of bi- or poly-functional epoxy compound or bi- or poly-functional epoxy resin (A), or adhesion, which is the effect of the present invention, is not attained. On the other hand, the amount to be used exceeding 150 parts by weight results in problems such as lowering in Tg or mechanical strength of cured products.

[Curing Accelerator (C)]

As curing accelerator (C) used in the present invention, any substance may be used without particular limitation as long as it accelerates curing reaction between the epoxy resins and the phenolic compounds or resins. Specific examples of the curing accelerator include phosphines such as tributylphosphine, triphenylphosphine, tris(dimethoxyphenyl)phosphine, tris(hydroxypropyl)phosphine, tris(cyanoethyl)phosphine, tris(trimethoxyphenyl)phosphine, tris(dimethoxyphenyl)phosphine, tris(trimethylphenyl)phosphine, and tris(dimethylphenyl)phosphine; phosphonium salts such as tetraphenylphosphonium tetraphenylborate, methyltributylphosphonium tetraphenylborate, and methyltricyanoethylphosphonium tetraphenylborate; imdazoles such as 2-methylimidazole, 2-phenylimidazole, 2-ethyl-4-methylimidazole, 2-undecylimidazole, 1-cyanoethyl-2-methylimidazole, 2,4-dicyano-6-(2-methylimidazolyl-(1))ethyl-s-triazine, and 2,4-dicyano-6-(2-undecylimidazolyl-(1))ethyl-s-triazine; imidazolium salts such as 1-cyanoethyl-2-undecylimidazolium trimellitate, 2-methylimidazolium isocyanurate, 2-ethyl-4-methylimidazolium tetraphenylborate, and 2-ethyl-1,4-dimethylimidazolium tetraphenylborate; pyridines such as N,N'-dimethylaminopyridine; amines such as 2,4,6-tris(dimethylaminomethyl)phenol, benzylmethylamine, tetramethylbutylguanidine, N-methylpiperazine, and 2-dimethylamino-1-pyrroline; ammonium salts such as triethylammonium tetraphenylborate; diazabicyclo compounds such as 1,5-diazabicyclo[5.4.0]-7-undecene, 1,5-diazabicyclo[4.3.0]-5-nonene, and 1,4-diazabicyclo[2.2.2]octane; tetraphenylborates, phenolates, phenol-novolac salts, and 2-ethylhexanoates of these diazabicyclo compounds; and others.

These curing accelerators (C) may be used alone or in combination of two or more. Curing accelerator (C) is used in an amount of 0.1 to 7 wt %, and preferably 0.3 to 5 wt %, with respect to the total weight of bi- or poly-functional epoxy compound or bi- or poly-functional epoxy resin (A) and hardener (B). Particularly preferred is 0.5 to 3 wt %, and most preferred is 0.8 to 2 wt %.

If the amount of curing accelerator (C) used is less than 0.1 wt %, the curing speed decreases, causing problems such as failure to exert the excellent properties of the epoxy resin composition due to insufficient curing and lowering the productivity because of prolonged curing time. On the other hand, if the amount exceeds 7 wt %, the curing speed is too fast, causing problems such as failure to control curing and lowering the heat resistance of the epoxy resin composition due to increased moisture absorption when a polar group-containing curing accelerator is used.

[Epoxy Resin Composition]

The epoxy resin composition of the present invention contains bi- or poly-functional epoxy compound or bi- or poly-functional epoxy resin (A), hardener (B), and curing accelerator (C).

i) Preparation Method

Any known preparation methods of epoxy resin compositions may be applied without particular limitations. Specifically, bi- or poly-functional epoxy compound or bi- or poly-functional epoxy resin (A), hardener (B), and curing accelerator (C) are mixed by dry-blending with a pulverizer such as Henschel mixer for several minutes to several hours, and weighed sample of the mixed powder is charged in a vessel such as a separable flask together with a solvent and dissolved at room temperature with a stirrer or the like to obtain an epoxy resin composition varnish. Since long-term storage of the epoxy resin composition varnish causes problems such as crystallization or deterioration in physical properties, it is recommended to avoid long-term storage of the varnish.

ii) Epoxy Equivalent of Epoxy Resin Composition

In the present invention, the epoxy equivalent of the bi- or poly-functional epoxy compound or bi- or poly-functional epoxy resin is preferably in a range of 170 to 1000 g/eq, more preferably 180 to 600 g/eq, and further preferably 200 to 400 g/eq. Epoxy equivalent lower than 170 results in increase in water absorption and lowering in heat resistance for the cured product after moisture absorption. Epoxy equivalent higher than 1000 g/eq is undesirable because of poor impregnation and dissolution properties and lowering in Tg of the cured product, which affects its heat resistance.

iii) Blending Amount

Hardener (B) is blended so that the hydroxyl groups in hardener (B) is preferably in the range of 0.3 to 1.5 equivalents, and more preferably in the range of 0.6 to 1.2 equivalents, relative to 1 epoxy equivalent of bi- or poly-functional epoxy compound or bi- or poly-functional epoxy resin (A). The above amount is preferred because such compositions provide cured products excellent in both flame retardancy and adhesion.

The amount of hardener (B) relative to bi- or poly-functional epoxy compound or bi- or poly-functional epoxy resin (A), and the amount of curing accelerator (C) relative to the total of bi- or poly-functional epoxy compound or bi- or poly-functional epoxy resin (A) and hardener (B) are as described above.

iv) Filler

The epoxy resin composition may contain, if needed, filler, which includes organic fillers and inorganic fillers. Specific examples of the organic filler include powdery epoxy resin (for example, TEPIC), melamine resin, benzoguanamine resin, urea resin, crosslinked acrylic polymers, and others. Specific examples of the inorganic filler include magnesium oxide, calcium carbonate, zirconium silicate, zirconium oxide, calcium silicate, aluminum hydroxide, magnesium hydroxide, calcium hydroxide, titanium oxide, silicon carbide, alumina, boron nitride, silica, glass fabrics, glass fibers, alumina fibers, and others. Among these, calcium carbonate is particularly preferable, because roughened surface can be easily obtained and adhesion strength to conductors can be increased when used for an insulating layer.

[Prepreg, Laminate, and Electronic Circuit Board]

The prepreg, laminate, and electronic circuit board of the present invention are obtained by forming a layer comprising an epoxy resin composition and a glass substrate on at least one surface of a copper foil or a metal layer with circuit patterns.

All of the prepreg, laminate, and electronic circuit board of the present invention can be prepared by known methods without particular limitation. Specifically, the epoxy resin composition of the present invention is dissolved in a solvent to prepare a varnish with a resin content of 30 to 70 wt %, and a glass substrate, such as a glass woven or non-woven fabric, is impregnated with this varnish and dried 120 to 180° C. for 80 to 250 minutes, to obtain the prepreg. The impregnation or drying may be performed under reduced pressure for defoaming or accelerating drying. A woven or non-woven fabric made of a material other than glass may be used, or such a fabric may be used in combination with the glass woven or non-woven fabric. A desired number of the prepregs thus prepared are stacked and hot-pressed to obtain the laminate. The laminate is further combined with copper foil, and hot-pressed to obtain the electronic circuit board.

In the step of hot-press, the epoxy resin composition is heat-treated. The heat-treatment may be done by any known methods without particular limitations. Specifically, the combined body is treated with a general-purpose press machine at 150° C. to 250° C. for a heating time of 1 minute to 10 hours under 0 to 3 MPa. Open-air condition is generally sufficient, but this step may be performed in an atmosphere of or in a stream of inert gas such as nitrogen, helium, and argon, or under reduced pressure for preventing oxidation or coloring.

As the glass substrate such as glass woven or non-woven fabrics used in the preparation method above, commercial products available at any time may be used without particular limitations.

Besides the above manufacturing method, there may be employed, a method in which copper foil is also stacked in preparing the laminate to obtain the electronic circuit board at a time, a method in which the varnish or paste of the epoxy resin composition is applied onto a foil of metal such as copper, a method in which the epoxy resin composition is formed into a sheet or film, which is bonded to a foil of metal such as copper, and others.

The varnish or paste may be either a solution or a heterogeneous suspension without limitation. Specific examples of the solvent used here include ketones such as methyl ethyl ketone, methyl isobutyl ketone, and cyclohexanone; aromatic hydrocarbons such as toluene and xylene; cellosolves such as cellosolve and butylcellosolve; carbitols such as carbitol and butylcarbitol; and acetates such as ethyl acetate, butyl acetate, cellosolve acetate, and butyl cellosolve acetate; and others, which may be used alone or as a mixture of two or more.

EXAMPLES

The present invention will be detailed with reference to Examples below, but the prevent invention is not limited thereto. The properties of the polymers obtained in Examples were determined by the following methods.

[Gel Time]

In curing the epoxy resin composition with stirring on a hot-plate at 175° C., the time from the beginning of heating, through progress of curing, until the twisted-yarn state was no longer observed by eyes was measured and counted as gel time.

[Glass Transition Temperature: Tg]

After a known weight of the epoxy resin composition was put in an aluminum cup and heated at 175° C. for 8 hours under nitrogen atmosphere in an inert oven for post-curing, Tg was measured with a TMA analyzer (TMA-50, manufactured by Shimadzu Corporation) by the needle penetration test (needle diameter: 0.5 mm, load: 10 g, constant-speed loading mode, at 5° C./min from room temperature to 300° C., under nitrogen at a flow rate of 100 ml/min).

[Flexural Modulus]

A blend of 14.5 parts by mass (of which 2 parts by mass of catalyst was counted separately from the other components, and hence the total was 102 parts by mass) of the epoxy resin composition, 0.5 parts by mass of waxes (carnauba wax and Hoechst E wax), and 87 parts by mass of spherical silica (trade name: YXK-35R; manufactured by Tatsumori Ltd.) was hot-kneaded with rolls at 100° C. for 3 minutes to prepare B-staged compound. The resultant compound was filled in a mold and kept at 175° C. for 200 seconds. After transfer-molded, the molding was post-cured at 175° C. for 8 hours under nitrogen atmosphere in an inert oven. With the specimen obtained, the flexural modulus was measured in accordance with JIS K6911.

[Flexural Strength]

A blend of 14.5 parts by mass (of which 2 parts by mass of catalyst was counted separately from the other components, and hence the total was 102 parts by mass) of the epoxy resin composition, 0.5 parts by mass of waxes (carnauba wax and Hoechst E wax), and 87 parts by mass of spherical silica (trade name: YXK-35R; manufactured by Tatsumori Ltd.) was hot-kneaded with rolls at 100° C. for 3 minutes to prepare B-staged compound. The compound obtained was filled in a mold and kept at 175° C. for 200 seconds. After transfer-molded, the molding was post-cured at 175° C. for 8 hours under nitrogen atmosphere in an inert oven. With the specimen obtained, the flexural strength was measured in accordance with JIS K6911.

[Moisture Absorption]

The mass of a specimen was measured before and after moisture absorption for 168 hours in an atmosphere at 85° C. with humidity of 85%. Moisture absorption was calculated based on the following equation.

$$\text{Moisture absorption (mass \%)} = (W2-W1)/W1, \text{ wherein}$$

W1: mass of the specimen before left at 85° C. with 85% humidity; and

W2: mass of the specimen after left at 85° C. with 85% humidity for 168 hours.

[Flame Retardancy]

The compound obtained in preparing the specimen for flexural modulus was filled in a mold and kept at 150° C. for 10 minutes for press molding. The press-molded compound was post-cured at 175° C. for 8 hours in nitrogen atmosphere in an inert oven, and a specimen was cut out therefrom. With this specimen, the flame retardancy was rated on the V-scale based on the vertical burn test in accordance with UL94.

[Reflow Resistance]

The compound obtained in preparing the specimen for flexural modulus was filled in a mold and kept at 175° C. for 200 seconds with a transfer molding machine to prepare a package 20-mm long, 20-mm wide, and 1.75-mm thick. The package was post-cured at 175° C. for 8 hours under nitrogen atmosphere in an inert oven, and then left in an atmosphere at 85° C. with 85% humidity to allow the package to adsorb moisture. At each time of 24 hours, 48 hours, 72 hours, 96 hours, and 168 hours of the exposure, five packages were taken out of the moist atmosphere, put in a reflow furnace, and kept at 250° C. for 10 seconds. After the packages were taken out and cooled to room temperature, each of the five packages was inspected with an ultrasonic microscope to examine the adhesion state between the resin and flame, that is, the presence or absence of crack or separation. The duration of moisture resistance was calculated from the following equation.

$$\text{Duration of moisture resistance (hours)} = 24 \times (S1/5) + 48 \times (S2/5) + 72 \times (S3/5) + 96 \times (S4/5) + 168 \times (S5/5),$$

wherein,

S1: number of packages having no crack or separation after 24-hour moisture absorption, S2: number of packages having no crack or separation after 48-hour moisture absorption, S3: number of packages having no crack or separation after 72-hour moisture absorption, S4: number of packages having no crack or separation after 96 hour moisture absorption, and S5: number of packages having no crack or separation after 168-hour moisture absorption.

[Hydroxyl Group Content in Phenolic Resin]

The hydroxyl group content in each phenolic resin was determined as follows: after the resin was acetylated with acetic anhydride in pyridine solvent, the excess reagent was hydrolyzed to yield acetic acid, which was titrated with a potassium hydroxide solution.

[Sulfur Atom Content in Phenolic Resin]

The sulfur atom content in each phenolic resin was determined by NMR spectrometry in chloroform, IR spectrometry, elemental analysis or the like.

Synthesis Example 1

In a glass reactor equipped with a thermometer, a dropping funnel, a Dean-Stark trap, a reflux condenser, a nitrogen inlet tube, and a stirrer, were charged 53.5 g (0.5 mol in terms of hydroxyl group) of phenol-novolac resin (trade name: PSM4261; manufactured by Gunei Chemical Industry Co., Ltd., hydroxyl equivalent: 107 g/eq) and 28.5 g (0.25 mol in terms of sulfur atom) of 2-thiophenemethanol (manufactured by Tokyo Chemical Industry Co., Ltd.). The inside temperature of the reactor was elevated to 140° C. under nitrogen stream, homogeneous melting of the content was confirmed, and 0.2 g of diethyl sulfate was then injected with a syringe while the inside temperature was kept at 140° C. After completion of injection, the reaction was conducted for 4 hours at the same temperature while water generated was removed. After absence of 2-thiophenemethanol in the reaction system was confirmed with a gel permeation chromatograph (Model: 830RI, manufactured by JASCO Corporation) and a gas chromatograph (Model: GC-1700, manufactured by Shimadzu Corporation), the modified phenolic resin represented by chemical formula (1) was discharged in a SUS tray.

Synthesis Example 2

The same type of reactor as in Synthesis Example 1 was charged with 53.5 g (0.5 mol in terms of hydroxyl group) of phenol-novolac resin (trade name: PSM4261; manufactured by Gunei Chemical Industry Co., Ltd., hydroxyl equivalent: 107 g/eq) and 57.1 g (0.5 mol in terms of sulfur atom) of 2-thiophenemethanol (manufactured by Tokyo Chemical Industry Co., Ltd.). The reaction was conducted under the same condition as in Synthesis Example 1 except that the reaction time was changed to 6 hours and that the amount of diethyl sulfate was changed to 0.4 g. After absence of 2-thiophenemethanol in the reaction system was confirmed by gel permeation chromatography and gas chromatography similarly to Synthesis Example 1, the modified phenolic resin represented by chemical formula (1) was discharged in a SUS tray.

Synthesis Example 3

The same type of reactor as in Synthesis Example 1 was charged with 53.5 g (0.5 mol in terms of hydroxyl group) of phenol-novolac resin (trade name: PSM4261; manufactured by Gunei Chemical Industry Co., Ltd., hydroxyl equivalent: 107 g/eq) and 114.2 g (1.0 mol in terms of sulfur atom) of 2-thiophenemethanol (manufactured by Tokyo Chemical Industry Co., Ltd.). The reaction was conducted under the same condition as in Synthesis Example 1 except that the reaction time was changed to 10 hours and that the amount of diethyl sulfate was changed to 0.6 g. After absence of 2-thiophenemethanol in the reaction system was confirmed by gel permeation chromatography and gas chromatography similarly to Synthesis Example 1, the modified phenolic resin represented by chemical formula (1) was discharged in a SUS tray.

Synthesis Example 4

The polyphenolic resin described in Japanese Patent Laid-Open Publication No. H10-237060 was synthesized. In a glass reactor equipped with a thermometer, a dropping funnel, a Dean-Stark trap, a reflux condenser, a nitrogen inlet tube, and a stirrer, 94.1 g (1 mol) of phenol (manufactured by Tokyo Chemical Industry Co., Ltd.), 50 g of methanol (manufactured by Tokyo Chemical Industry Co., Ltd.), and 10 g (0.25 mol) of sodium hydroxide (manufactured by Tokyo Chemical Industry Co., Ltd.) were charged. The bath temperature was elevated to 100° C. while nitrogen was flowed through the reactor, and when phenol was homogeneously dissolved and the reaction mixture became refluxed, 56.1 g (0.5 mol) of 2-thiophenecarboxaldehyde (manufactured by Tokyo Chemical Industry Co., Ltd.) was added dropwise over 2 hours. The reaction was continued for 50 hours. After absence of 2-thiophenecarboxaldehyde in the reaction system was confirmed with a gel permeation chromatograph (Model: 830RI, manufactured by JASCO Corporation) and a gas chromatograph (Model: GC-1700, manufactured by Shimadzu Corporation), the reaction mixture was neutralized with hydrochloric acid, here was added 200 g of methyl isobutyl ketone, the organic phase was washed with water several times. After unreacted phenol and methyl isobutyl ketone were distilled off by heating under reduced pressure, the polyphenolic resin represented by chemical formula (21) below was discharged in a SUS tray.

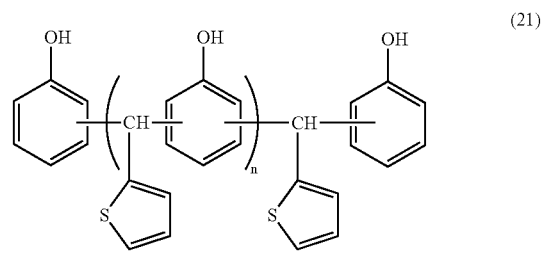

(21)

Synthesis Example 5

The same type of reactor as in Synthesis Example 1 was charged with 72.0 g (0.4 mol in terms of hydroxyl group) of phenol-dicyclopentadiene resin (trade name: DPR5000; manufactured by Mitsui Chemicals, Inc., hydroxyl equivalent: 180 g/eq) and 22.8 g (0.2 mol in terms of sulfur atom) of 2-thiophenemethanol (manufactured by Tokyo Chemical Industry Co., Ltd.). The reaction was conducted under the same condition as in Synthesis Example 1. After absence of 2-thiophenemethanol in the reaction system was confirmed by gel permeation chromatography and gas chromatography similarly to Synthesis Example 1, the modified phenolic resin represented by chemical formula (5) was discharged in a SUS tray.

Synthesis Example 6

The same type of reactor as in Synthesis Example 1 was charged with 68.8 g (0.4 mol in terms of hydroxyl group) of phenol-aralkyl resin (trade name: XLC-4L; manufactured by Mitsui Chemicals, Inc., hydroxyl equivalent: 172 g/eq) and 11.4 g (0.1 mol) of 2-thiophenemethanol (manufactured by Tokyo Chemical Industry Co., Ltd.). The reaction was conducted under the same condition as in Synthesis Example 1 except that the reaction time was changed to 3 hours. After absence of 2-thiophenemethanol in the reaction system was confirmed by gel permeation chromatography and gas chromatography similarly to Synthesis Example 1, the modified phenolic resin represented by chemical formula (9) was discharged in a SUS tray.

Synthesis Example 7

The same type of reactor as in Synthesis Example 1 was charged with 68.8 g (0.4 mol in terms of hydroxyl group) of phenol-aralkyl resin (trade name: XLC-4L; manufactured by Mitsui Chemicals, Inc., hydroxyl equivalent: 172 g/eq) and 22.8 g (0.2 mol in terms of sulfur atom) of 2-thiophenemethanol (manufactured by Tokyo Chemical Industry Co., Ltd.). The reaction was conducted under the same condition as in Synthesis Example 1. After absence of 2-thiophenemethanol in the reaction system was confirmed by gel permeation chromatography and gas chromatography similarly to Synthesis Example 1, the modified phenolic resin represented by chemical formula (9) was discharged in a SUS tray.

Synthesis Example 8

The same type of reactor as in Synthesis Example 1 was charged with 68.8 g (0.4 mol in terms of hydroxyl group) of phenol-aralkyl resin (trade name: XLC-4L; manufactured by Mitsui Chemicals, Inc., hydroxyl equivalent: 172 g/eq) and 22.8 g (0.2 mol in terms of sulfur atom) of 3-thiophenemethanol (manufactured by Tokyo Chemical Industry Co., Ltd.). The reaction was conducted under the same condition as in Synthesis Example 1. After absence of 3-thiophenemethanol in the reaction system was confirmed by gel permeation chromatography and gas chromatography similarly to Synthesis Example 1, the modified phenolic resin represented by chemical formula (10) was discharged in a SUS tray.

Synthesis Example 9

The same type of reactor as in Synthesis Example 1 was charged with 68.8 g (0.4 mol in terms of hydroxyl group) of phenol-aralkyl resin (trade name: XLC-4L; manufactured by Mitsui Chemicals, Inc., hydroxyl equivalent: 172 g/eq) and 25.6 g (0.2 mol in terms of sulfur atom) of 2-thiopheneethanol (manufactured by Tokyo Chemical Industry Co., Ltd.). The reaction was conducted under the same condition as in Synthesis Example 1. After absence of 2-thiopheneethanol in the reaction system was confirmed by gel permeation chromatography and gas chromatography similarly to Synthesis Example 1, the modified phenolic resin represented by chemical formula (11) was discharged in a SUS tray.

Synthesis Example 10

The same type of reactor as in Synthesis Example 1 was charged with 69.0 g (0.3 mol in terms of hydroxyl group) of phenol-biphenylaralkyl resin (trade name: MEH7851SS; manufactured by Meiwa Plastic Industries, LTD., hydroxyl equivalent: 230 g/eq) and 3.4 g (0.03 mol in terms of sulfur atom) of 2-thiophenemethanol (manufactured by Tokyo Chemical Industry Co., Ltd.). The reaction was conducted under the same condition as in Synthesis Example 1 except that the reaction time was changed to 2 hours. After absence of 2-thiophenemethanol in the reaction system was confirmed by gel permeation chromatography and gas chromatography similarly to Synthesis Example 1, the modified phenolic resin represented by chemical formula (13) was discharged in a SUS tray.

Synthesis Example 11

The same type of reactor as in Synthesis Example 1 was charged with 69.0 g (0.3 mol in terms of hydroxyl group) of phenol-biphenylaralkyl resin (trade name: MEH7851SS; manufactured by Meiwa Plastic Industries, LTD., hydroxyl equivalent: 230 g/eq) and 8.6 g (0.075 mol in terms of sulfur atom) of 2-thiophenemethanol (manufactured by Tokyo Chemical Industry Co., Ltd.). The reaction was conducted under the same condition as in Synthesis Example 1 except that the reaction time was changed to 3 hours. After absence of 2-thiophenemethanol in the reaction system was confirmed by gel permeation chromatography and gas chromatography similarly to Synthesis Example 1, the modified phenolic resin represented by chemical formula (13) was discharged in a SUS tray.

Synthesis Example 12

The same type of reactor as in Synthesis Example 1 was charged with 65.4 g (0.3 mol in terms of hydroxyl group) of naphthol-aralkyl resin (trade name: α-NX-3.2; manufactured by Mitsui Chemicals, Inc., hydroxyl equivalent: 218 g/eq) and 17.1 g (0.15 mol in terms of sulfur atom) of 2-thiophenemethanol (manufactured by Tokyo Chemical Industry Co., Ltd.). The reaction was conducted under the same condition as in Synthesis Example 1. After absence of 2-thiophenemethanol in the reaction system was confirmed by gel permeation chromatography and gas chromatography similarly to Synthesis Example 1, the modified phenolic resin represented by chemical formula (17) was discharged in a SUS tray.

Example 1

After 44.5 g (0.29 gram-equivalents) of the modified phenol-novolac resin (hydroxyl equivalent: 155 g/eq) in Synthesis Example 1 as a hardener and 2 g (2%) of triphenylphosphine as a curing accelerator were melt-kneaded at 140° C. for 10 min and then cooled to 100° C., here was added 55.5 g (0.29 gram-equivalents) of biphenol-type epoxy resin (trade name: YX4000H; available form Japan Epoxy Resins Co., Ltd, epoxy equivalent: 193 g/eq). The mixture was melt-kneaded at 100° C. for 5 min to prepare a homogeneous resin composition.

The evaluation results for the gel time and glass transition temperature (Tg) of this epoxy resin composition are shown in Table 1. The evaluation results for the flexural modulus, flexural strength, moisture absorption, flame retardancy, and reflow resistance of a cured product of the epoxy resin composition are shown in Table 1.

Example 2

The same experiment as Example 1 was conducted except that the hardener was replaced by 51.4 g (0.25 gram-equivalents) of the modified phenol-novolac resin (hydroxyl equivalent: 207 g/eq) in Synthesis Example 2 and that the epoxy resin was replaced by 48.6 g (0.25 gram-equivalents) of biphenol-type epoxy resin (trade name: YX4000H; manufactured by Japan Epoxy Resins Co., Ltd., epoxy equivalent: 193 g/eq). The results are shown in Table 1.

Example 3

The same experiment as Example 1 was conducted except that the hardener was replaced by 74.9 g (0.25 gram-equivalents) of the modified phenol-novolac resin (hydroxyl equivalent: 300 g/eq) in Synthesis Example 3 and that the epoxy resin was replaced by 48.6 g (0.25 gram-equivalents) of biphenol-type epoxy resin (trade name: YX4000H; manufactured by Japan Epoxy Resins Co., Ltd., epoxy equivalent: 193 g/eq). The results are shown in Table 1.

Comparative Example 1

The same experiment as Example 1 was conducted except that the hardener was replaced by 35.7 g (0.33 gram-equivalents) of phenol-novolac resin (trade name: PSM4261; manufactured by Gunei Chemical Industry, Co., Ltd., hydroxyl equivalent: 107 g/eq) and that the epoxy resin was replaced by 64.3 g (0.33 gram-equivalents) of biphenol-type epoxy resin (trade name: YX4000H; manufactured by Japan Epoxy Resins Co., Ltd., epoxy equivalent: 193 g/eq). The results are shown in Table 2.

Comparative Example 2

The same experiment as Example 1 was conducted except that the hardener was replaced by 50.5 g (0.27 gram-equivalents) of the polyphenolic resin (hydroxyl equivalent: 189 g/eq) in Synthesis Example 4 and that the epoxy resin was replaced by 49.5 g (0.27 gram-equivalents) of biphenol-type epoxy resin (trade name: YX4000H; manufactured by Japan Epoxy Resins Co., Ltd., epoxy equivalent: 193 g/eq). The results are shown in Table 2.

Example 4

The same experiment as Example 1 was conducted except that the hardener was replaced by 54.4 g (0.24 gram-equivalents) of the modified phenol-dicyclopentadiene resin (hydroxyl equivalent: 228 g/eq) in Synthesis Example 5 and that the epoxy resin was replaced by 45.8 g (0.24 gram-equivalents) of biphenol-type epoxy resin (trade name: YX4000H; manufactured by Japan Epoxy Resins Co., Ltd., epoxy equivalent: 193 g/eq). The results are shown in Table 1.

Comparative Example 3

The same experiment as Example 1 was conducted except that the hardener was replaced by 48.3 g (0.27 gram-equivalents) of a phenol-dicyclopentadiene resin (trade name: DPR5000; manufactured by Mitsui Chemicals, Inc., hydroxyl equivalent: 180 g/eq) and that the epoxy resin was replaced by 51.7 g (0.27 gram-equivalents) of biphenol-type epoxy resin (trade name: YX4000H; manufactured by Japan Epoxy Resins Co., Ltd., epoxy equivalent: 193 g/eq). The results are shown in Table 2.

Example 5

The same experiment as Example 1 was conducted except that the hardener was replaced by 50.4 g (0.26 gram-equivalents) of the modified phenol-aralkyl resin (hydroxyl equivalent: 196 g/eq) in Synthesis Example 6 and the epoxy resin was replaced by 49.4 g (0.26 gram-equivalents) of biphenol-type epoxy resin (trade name: YX4000H; manufactured by Japan Epoxy Resins Co., Ltd., epoxy equivalent: 193 g/eq). The results are shown in Table 1.

Example 6

The same experiment as Example 1 was conducted except that the hardener was replaced by 53.3 g (0.24 gram-equivalents) of the modified phenol-aralkyl resin (hydroxyl equivalent: 220 g/eq) in Synthesis Example 7 and that the epoxy resin was replaced by 46.7 g (0.24 gram-equivalents) of biphenol-type epoxy resin (trade name: YX4000H; manufactured by Japan Epoxy Resins Co., Ltd., epoxy equivalent: 193 g/eq). The results are shown in Table 1.

Example 7

The same experiment as Example 1 was conducted except that the hardener was replaced by 53.3 g (0.24 gram-equivalents) of the modified phenol-aralkyl resin (hydroxyl equivalent: 220 g/eq) in Synthesis Example 8 and that the epoxy resin was replaced by 46.7 g (0.24 gram-equivalents) of biphenol-type epoxy resin (trade name: YX4000H; manufactured by Japan Epoxy Resins Co., Ltd., epoxy equivalent: 193 g/eq). The results are shown in Table 1.

Example 8

The same experiment as Example 1 was conducted except that the hardener was replaced by 54.1 g (0.24 gram-equivalents) of the modified phenol-aralkyl resin (hydroxyl equivalent: 227 g/eq) in Synthesis Example 9 and that the epoxy resin was replaced by 45.9 g (0.24 gram-equivalents) of biphenol-type epoxy resin (trade name: YX4000H; manufactured by Japan Epoxy Resins Co., Ltd., epoxy equivalent: 193 g/eq). The results are shown in Table 1.

Comparative Example 4

The same experiment as Example 1 was conducted except that the hardener was replaced by 47.1 g (0.27 gram-equivalents) of phenol-aralkyl resin ("XLC-4L"™, manufactured by Mitsui Chemicals, Inc., hydroxyl equivalent: 172 g/eq) and that the epoxy resin was replaced by 52.9 g (0.27 gram-equivalents) of biphenol-type epoxy resin (trade name: YX4000H; manufactured by Japan Epoxy Resins Co., Ltd., epoxy equivalent: 193 g/eq). The results are shown in Table 2.

Example 9

The same experiment as Example 1 was conducted except that the hardener was replaced by 46.8 g (0.20 gram-equivalents) of the modified phenol-biphenylaralkyl resin (hydroxyl equivalent: 240 g/eq) in Synthesis Example 10, and that the curing accelerator was replaced by 1 g (1%) of triphenylphosphine, and that the epoxy resin was replaced by 53.2 g (0.20 gram-equivalents) of biphenyl-aralkyl-type epoxy resin (trade name: NC3000; manufactured by Nippon Kayaku Co., Ltd., epoxy equivalent: 273 g/eq). The results are shown in Table 1.

Example 10

The same experiment as Example 1 was conducted except that the hardener was replaced by 48.2 g (0.19 gram-equivalents) of the modified phenol-biphenylaralkyl resin (hydroxyl equivalent: 254 g/eq) in Synthesis Example 11, and that the curing accelerator was replaced by 1 g (1%) of triphenylphosphine, and that the epoxy resin was replaced by 51.8 g (0.19 gram-equivalents) of biphenyl-aralkyl-type epoxy resin (trade name: NC3000; manufactured by Nippon Kayaku Co., Ltd., epoxy equivalent: 273 g/eq). The results are shown in Table 1.

Comparative Example 5

The same experiment as Example 1 was conducted except that the hardener was replaced by 45.7 g (0.20 gram-equivalents) of phenol-biphenylaralkyl resin (trade name: MEH7851SS; manufactured by Meiwa Plastic Industries, Ltd., hydroxyl equivalent: 230 g/eq), and that the curing accelerator was replaced by 1 g (1%) of triphenylphosphine, and that the epoxy resin was replaced by 54.3 g (0.20 gram-equivalents) of biphenyl-aralkyl-type epoxy resin (trade name: NC3000; manufactured by Nippon Kayaku Co., Ltd., epoxy equivalent: 273 g/eq). The results are shown in Table 2.

Example 11

The same experiment as Example 1 was conducted except that the hardener was replaced by of 58.0 g (0.22 gram-equivalents) of the modified naphthol-aralkyl resin (hydroxyl equivalent: 266 g/eq) in Synthesis Example 12 and that the epoxy resin was replaced by 42.0 g (0.22 gram-equivalents) of biphenol-type epoxy resin (trade name: YX4000H; manufactured by Japan Epoxy Resins Co., Ltd., epoxy equivalent: 193 g/eq). The results are shown in Table 1.

Comparative Example 6

The same experiment as Example 1 was conducted except that the hardener was replaced by 53.0 g (0.24 gram-equivalents) of naphthol-aralkyl resin (trade name: α-NX-3.2; manufactured by Mitsui Chemicals, Inc., hydroxyl equivalent: 218 g/eq) and that the epoxy resin was replaced by 47.0 g (0.24 gram-equivalents) of biphenol-type epoxy resin (trade name: YX4000H; manufactured by Japan Epoxy Resins Co., Ltd., epoxy equivalent: 193 g/eq). The results are shown in Table 2.

TABLE 1

| | | Unit | Example 1 | 2 | 3 | 4 | 5 | 6 | 7 | 8 | 9 | 10 | 11 |
|---|---|---|---|---|---|---|---|---|---|---|---|---|---|
| Gel time | | sec | 40 | 39 | 42 | 45 | 42 | 43 | 40 | 44 | 47 | 42 | 45 |
| Glass transition temperature (Tg) | | °C. | 129 | 128 | 128 | 105 | 111 | 114 | 109 | 106 | 120 | 118 | 107 |
| Flexural modulus | | MPa | 180 | 168 | 168 | 162 | 172 | 169 | 175 | 173 | 169 | 160 | 165 |
| Flexural strength | | GPa | 23 | 22 | 23 | 23 | 23 | 23 | 23 | 22 | 22 | 22 | 22 |
| Moisture absorption | | mass % | 0.20 | 0.20 | 0.19 | 0.18 | 0.17 | 0.18 | 0.18 | 0.18 | 0.13 | 0.13 | 0.15 |
| Flame Retardancy | Specimen thickness | inch | 1/8 | 1/8 | 1/8 | 1/8 | 1/8 | 1/8 | 1/8 | 1/8 | 1/8 | 1/8 | 1/8 |
| | Rating (UL94) | — | V-0 | V-0 | V-0 | V-1 | V-1 | V-0 | V-0 | V-1 | V-0 | V-0 | V-0 |
| Reflow resist-ance | Moisture Absorption time: 24 hours [1] | pieces | 0 | 0 | 0 | 0 | 0 | 0 | 0 | 0 | 0 | 0 | 0 |
| | Moisture Absorption time: 48 hours [1] | pieces | 0 | 0 | 0 | 0 | 0 | 0 | 0 | 0 | 0 | 0 | 0 |
| | Moisture Absorption time: 72 hours [1] | pieces | 2 | 1 | 2 | 1 | 0 | 0 | 0 | 0 | 0 | 0 | 0 |
| | Moisture Absorption time: 96 hours [1] | pieces | 5 | 5 | 5 | 4 | 0 | 0 | 0 | 1 | 1 | 0 | 0 |
| | Moisture Absorption time: 168 hours [1] | pieces | 5 | 5 | 5 | 5 | 1 | 0 | 0 | 1 | 1 | 0 | 1 |
| | Moisture resistance duration | hours | 115.2 | 129.6 | 115.2 | 148.8 | 374.4 | 408.0 | 408.0 | 355.2 | 355.2 | 408.0 | 374.4 |

[1] number of packages having crack or separation in 5 packages tested

TABLE 2

| | | Unit | Comparative Example 1 | 2 | 3 | 4 | 5 | 6 |
|---|---|---|---|---|---|---|---|---|
| Gel time | | sec | 36 | 63 | 45 | 40 | 45 | 43 |
| Glass transition temperature (Tg) | | °C. | 132 | 138 | 105 | 115 | 122 | 112 |
| Flexural strength | | MPa | 170 | 130 | 162 | 178 | 168 | 162 |
| Flexural modulus | | GPa | 22 | 22 | 23 | 23 | 21 | 23 |
| Moisture absorption | | mass % | 0.21 | 0.20 | 0.18 | 0.18 | 0.13 | 0.15 |
| Flame retardancy | Specimen thickness | inch | 1/8 | 1/8 | 1/8 | 1/8 | 1/8 | 1/8 |
| | Rating (UL94) | — | V-1 | V-1 | Out of rating | V-1 | V-0 | V-1 |
| Reflow resistance | Moisture Absorption time: 24 hours [1] | pieces | 1 | 1 | 0 | 0 | 0 | 0 |
| | Moisture Absorption time: 48 hours [1] | pieces | 5 | 4 | 1 | 0 | 0 | 0 |

TABLE 2-continued

|  | Unit | Comparative Example | | | | | |
|---|---|---|---|---|---|---|---|
|  |  | 1 | 2 | 3 | 4 | 5 | 6 |
| Moisture Absorption time: 72 hours *[1] | pieces | 5 | 5 | 3 | 0 | 0 | 1 |
| Moisture Absorption time: 96 hours *[1] | pieces | 5 | 5 | 5 | 0 | 3 | 1 |
| Moisture Absorption time: 168 hours *[1] | pieces | 5 | 5 | 5 | 5 | 3 | 5 |
| Moisture resistance duration | hours | 19.2 | 28.8 | 91.2 | 240.0 | 276.0 | 206.4 |

*[1] number of packages having cracks or separation in 5 packages tested

[Discussion on Effects of the Present Invention]

Owing to the structure in which the side chain of an aromatic ring having a hydroxyl group is substituted with the group represented by general formula (1-1), the modified phenolic resin of the present invention can exhibit significantly improved performances in adhesion and flame retardancy without causing any deterioration in the curing property, glass transition temperature, moisture absorption, and mechanical properties such as flexural strength of the conventional phenol-novolac resins and phenol-aralkyl resins.

The duration of moisture resistance is 115 to 130 hours (Examples 1 to 3) for the modified phenol-novolac resins of the present invention as opposed to 19 hours for the phenol-novolac resin (Comparative Example 1); 149 hours (Example 4) for the modified phenol-dicyclopentadiene resin of the present invention as opposed to 91 hours for the phenol-dicyclopentadiene resin (Comparative Example 3); 374 to 408 hours (Examples 5 to 8) for the modified phenol-aralkyl resins of the present invention as opposed to 240 hours for the phenol-aralkyl resin (Comparative Example 4); 355 to 408 hours (Examples 9 and 10) for the modified phenol-biphenylaralkyl resins of the present invention as opposed to 276 hours for the phenol-biphenylaralkyl resin (Comparative Example 5); and 374 hours (Example 11) for the modified naphthol-aralkyl resin of the present invention as opposed to 206 hours for the naphthol-aralkyl resin (Comparative Example 6). The modified phenolic resins of the present invention exhibit a quite excellent effect in the durability of moisture resistance as compared with the conventional phenolic resins.

In addition, the flame retardancy in the UL94 test is V-0 for the modified phenol-novolac resin of the present invention as opposed to V-1 for the phenol-novolac resin (Comparative Example 1); V-0 to V-1 for the modified phenol-aralkyl resins of the present invention as opposed to V-1 for the phenol-aralkyl resin (Comparative Example 4); and V-0 (Example 11) for the modified naphthol-aralkyl resin of the present invention as opposed to V-1 for the naphthol-aralkyl resin (Comparative Example 6). The modified phenolic resins of the present invention are superior in flame retardancy to the conventional phenolic resins.

The properties of the polymers obtained in Examples and Comparative Examples below were determined by the following methods.
i) Glass Transition Temperature, Tg The laminates obtained in Examples and Comparative Examples were cut out, and Tg was measured with a TMA analyzer (TMA-50, manufactured by Shimadzu Corporation) at a compression mode under the following conditions: 10 g of load, constant-speed loading mode, 5° C./min, from room temperature to 300° C., and nitrogen atmosphere at a flow rate of 100 ml/min.
ii) Copper Foil Peeling Strength Copper foil peeling strength was measured with the laminates prepared in Examples and Comparative Examples in accordance with JIS C-6481.
iii) Flame Retardancy With the laminates prepared in Examples and Comparative Examples, the vertical burn test was conducted in accordance with UL94 to rate the flame retardancy on the V-scale.
iv) Soldering Heat Resistance Each specimen was treated in a steam bath at 121° C. under 2.0 atm for 3 hours, and then immersed in solder at 260° C. for 20 seconds (C-3/121/100). The specimen was inspected to examine the presence or absence of appearance anomalies such as swelling and separation, and rated as "Good" when no anomalies were observed or "Poor" when anomalies were present.
v) Hydroxyl Group Content in Phenolic Resin Hydroxyl group content in phenolic resin was determined as follows: the resin was acetylated with acetic anhydride in pyridine solvent, and the excess reagent was hydrolyzed to yield acetic acid, which was titrated with a potassium hydroxide solution.

Synthesis Example 13

In a glass reactor equipped with a thermometer, a dropping funnel, a Dean-Stark trap, a reflux condenser, a nitrogen inlet tube, and a stirrer, 53.5 g (0.5 mol in terms of hydroxyl group) of phenol-novolac resin (trade name: PSM4261; manufactured by Gunei Chemical Industry Co., Ltd., hydroxyl equivalent: 107 g/eq) and 28.5 g (0.25 mol in terms of sulfur atom) of 2-thiophenemethanol (manufactured by Tokyo Chemical Industry Co., Ltd.) were charged. While nitrogen flowed through the reactor, the inside temperature of the reactor was elevated to 140° C. After homogeneous melting of the content was confirmed, while the inside temperature of the reactor was kept at 140° C., 0.2 g of diethyl sulfate was injected with a syringe. After completion of injection, the reaction was conducted for 4 hours at the same temperature while water generated was removed. The change of molecular weight with time was monitored with a gel permeation chromatograph (Model: 830RI, manufactured by JASCO Corporation), and the consumption of 2-thiophenemethanol was monitored with a gas chromatograph (Model: GC-1700, manufactured by Shimadzu Corporation). After the absence of 2-thiophenemethanol in the reaction system was confirmed, the modified phenolic resin represented by chemical formula (1) was discharged in a SUS tray.

The sulfur content was estimated by the quantitative analysis according to the oxygen flask combustion method. x, y, and z were estimated from M/Z of ions detected by field desorption mass spectrometry. The results of these analyses showed that the average of recurring unit number, n, of the modified phenolic resin was 2.2, the sulfur content was 10.2%, and the sum of x, y, and z was 3.

Synthesis Example 14

The reaction was performed similarly to Synthesis Example 13 except that the amount of 2-thiophenemethanol was changed to 57.1 g, and that the reaction time was changed to 6 hours, and that the amount of diethyl sulfate was changed to 0.4 g, in Synthesis Example 13. Similarly to Synthesis Example 13, the change of molecular weight with time was monitored with a gel permeation chromatograph, and the consumption of 2-thiophenemethanol was monitored with a gas chromatograph. After absence of 2-thiophenemethanol in the reaction system was confirmed, the modified phenolic resin represented by chemical formula (1) was discharged in a SUS tray.

The results of quantitative analysis for sulfur and the field desorption mass spectrometry showed that the average of recurring unit number, n, was 2.1, the sulfur content was 15.1%, and the sum of x, y, and z was 3.

Synthesis Example 15

The same type of reactor as in Synthesis Example 13 was charged with 68.8 g (0.4 mol in terms of hydroxyl group) of phenol-aralkyl resin (trade name: XLC-4L; manufactured by Mitsui Chemicals, Inc., hydroxyl equivalent: 172 g/eq) and 22.8 g (0.2 mol in terms of sulfur atom) of 2-thiophenemethanol (manufactured by Tokyo Chemical Industry Co., Ltd.). The reaction was performed under the same condition as in Synthesis Example 13. Similarly to Synthesis Example 13, the change of molecular weight with time was monitored with a gel permeation chromatograph, and the consumption of 2-thiophenemethanol was monitored with a gas chromatograph. After absence of 2-thiophenemethanol in the reaction system was confirmed, the modified phenolic resin represented by chemical formula (1) was discharged in a SUS tray.

The results of quantitative analysis for sulfur and the field desorption ionization/time-of-flight mass spectrometry showed that the average of recurring unit number, n, was 3.4, the sulfur content was 6.3%, and the sum of x, y, and z was 3.

Example 12

A varnish was prepared by dissolving 44.3 g (79.5 parts by weight, 1 hydroxyl equivalent per epoxy equivalent) of the modified phenol-novolac resin (hydroxyl equivalent: 155 g/eq) obtained in Synthesis Example 13 as a hardener, 55.7 g (100 parts by weight) of o-cresol-novolac type epoxy resin (trade name: EOCN-102S; manufactured by Nippon Kayaku Co., Ltd., epoxy equivalent: 195 g/eq) as an epoxy resin, and 2.0 g of TPP (triphenylphosphine) as a curing catalyst in 67 g of methyl ethyl ketone. The gel time of the resulting varnish was 7 minutes at 140° C. A glass substrate (E-glass fabric", 100 μm, manufactured by Nitto Boseki Co., Ltd.) was impregnated with this varnish and dried at 140° C. for 5 minutes to obtain a prepreg. The resulting prepreg was tack-free and excellent in workability. Ten sheets of the prepregs were stacked, a 18-μm thick electrolyzed copper foil (manufactured by Mitsui Mining & Smelting Co., Ltd.) was put on each of the top and bottom of the stack, and the assembly was molded at 175° C. under a molding pressure of 2.45 MPa for 2 hours to obtain a laminate covered with copper on both sides having a resin content of 50% and a thickness of 1.2 mm.

Example 13

The same experiment as Example 12 was conducted except that the hardener was replaced by 51.4 g (105.5 parts by weight, 1 hydroxyl equivalent per epoxy equivalent) of the modified phenol-novolac resin (hydroxyl equivalent: 204 g/eq) in Synthesis Example 14 and that the epoxy resin was replaced by 48.6 g (100 parts by weight) of o-cresol-novolac epoxy resin (trade name: EOCN-102S; manufactured by Nippon Kayaku Co., Ltd., epoxy equivalent: 195 g/eq). The results are shown in Table 3.

Example 14

The same experiment as Example 12 was conducted except that the hardener was replaced by 47.8 g (91.6 parts by weight, 1 hydroxyl equivalent per epoxy equivalent) of the modified phenol-aralkyl resin (hydroxyl equivalent: 220 g/eq) in Synthesis Example 15 and that the epoxy resin was replaced by 52.2 g (100 parts by weight) of phenol-aralkyl epoxy resin (trade name: E-XLC4L; manufactured by Mitsui Chemicals, Inc., epoxy equivalent: 240 g/eq). The results are shown in Table 3.

Comparative Example 7

The same experiment as Example 12 was conducted except that the hardener was replaced by 35.4 g (54.4 parts by weight, 1 hydroxyl equivalent per epoxy equivalent) of phenol-novolac resin (trade name: PSM-4261; manufactured by Gunei Chemical Industry Co., Ltd., hydroxyl equivalent: 107 g/eq) and that the epoxy resin was replaced by 64.6 g (100 parts by weight) of o-cresol-novolac epoxy resin (trade name: EOCN-102S; manufactured by Nippon Kayaku Co., Ltd., epoxy equivalent: 195 g/eq). The results are shown in Table 3.

Comparative Example 8

The same experiment as Example 12 was conducted except that the hardener was replaced by 41.7 g (71.5 parts by weight, 1 hydroxyl equivalent per epoxy equivalent) of phenol-aralkyl resin (trade name: XLC-4L; manufactured by Mitsui Chemicals, Inc., hydroxyl equivalent: 172 g/eq) and that the epoxy resin was replaced by 58.3 g (100 parts by weight) of phenol-aralkyl epoxy resin (trade name: E-XLC4L; manufactured by Mitsui Chemicals, Inc., epoxy equivalent: 240 g/eq). The results are shown in Table 3.

TABLE 3

| | Example 12 | Example 13 | Example 14 | Comparative Example 7 | Comparative Example 8 |
|---|---|---|---|---|---|
| Tg (° C.) | 188 | 186 | 168 | 189 | 168 |
| Copper foil peeling strength (N/cm) | 15.1 | 15.5 | 18.1 | 14.1 | 17.2 |

TABLE 3-continued

|  | Example 12 | Example 13 | Example 14 | Comparative Example 7 | Comparative Example 8 |
|---|---|---|---|---|---|
| Flame retardancy (UL-94) | V-1 | V-1 | V-0 | Out of rating | V-1 |
| Soldering heat resistance | Good | Good | Good | Good | Good |

[Discussion on Examples and Comparative Examples]

Owing to the structure in which the side chain of an aromatic ring having a hydroxyl group is substituted with the group represented by general formula (1-2), the modified phenolic resin of the present invention can exhibit largely improved performances in adhesion and flame retardancy without causing any deterioration in the thermal property in terms of glass transition temperature of the conventional phenol-novolac resins and phenol-aralkyl resins.

i) Copper Foil Peeling Strength (Adhesion)

The copper foil peel strength was 15.1 and 15.5 N/cm for Examples 12 and 13, respectively, in which the modified phenol-novolac resins of the present invention were used, as opposed to 14.1 N/cm for Comparative Example 7. Further, the copper foil peel strength was 18.1 N/cm for Example 14, in which the modified phenol-aralkyl resin of the present invention was used, as opposed to 17.2 N/cm for Comparative Example 8. Accordingly, the modified phenolic resins of the present invention provide extremely superior adhesion to conventional phenolic resins.

ii) Flame Retardancy

On the UL94 scale, Examples 12 and 13 were rated as V-1, while Comparative Example 7 was "out of rating". Further, the rating was V-0 for Example 14, as opposed to V-1 for Comparative Example 8. Thus, the compositions in Examples have superior flame retardancy.

INDUSTRIAL APPLICABILITY

The epoxy resin composition in which the modified phenolic resin of the present invention is used as a hardener, and the cured epoxy resin obtained therefrom are used widely as insulating materials for electrical/electronic components such as semiconductor sealing materials, for laminates such as printed circuit boards, as adhesives, molding materials, paints, and others.

The prepreg of the present invention having a glass substrate impregnated with the epoxy resin composition, the laminate formed by stacking the prepregs, and the electronic circuit board using the laminate are used widely for printed circuit boards of electronic appliances, industrial machines, personal computers, communication instruments such as cellular phones, various controlling instruments, automobiles, trains, airplanes, and others.

The invention claimed is:

1. A modified phenolic resin that is an alternating copolymer of at least one phenolic compound selected from phenol, naphthols, and their derivatives and a compound having a divalent connecting group, said modified phenolic resin having a side chain attached to an aromatic ring having a hydroxy group, said side chain being represented by general formula (1-1):

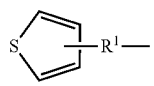
(1-1)

wherein $R^1$ represents a linear, branched, or cyclic hydrocarbon group having 1 to 8 carbon atoms.

2. The modified phenolic resin according to claim 1, which contains sulfur atoms in an amount of 0.01 to 2 moles per mole of hydroxyl groups.

3. The modified phenolic resin according to claim 1, which is represented by general formula (2-1):

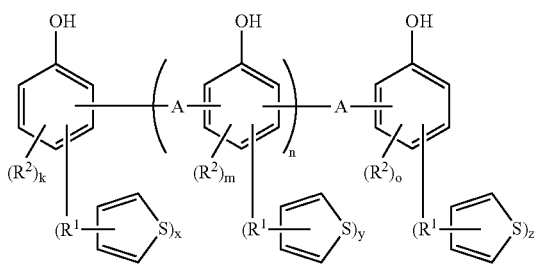
(2-1)

wherein $R^1$ represents a linear, branched, or cyclic hydrocarbon group having 1 to 8 carbon atoms; $R^2$s may be identical or different and each of them represents a hydrogen atom, halogen atom, hydroxyl group, phenyl group, or linear, branched, or cyclic alkyl or alkoxy group having 1 to 10 carbon atoms; connecting group A represents a hydrocarbon group having 1 to 20 carbon atoms; each of k, o, x and z represents an integer of 0 to 4; each of m and y represents an integer of 0 to 3; the sum of x, y, and z is an integer of 1 to 11; and the recurring unit number, n, represents an integer of 0 to 50.

4. The modified phenolic resin according to claim 1, which is represented by general formula (3-1):

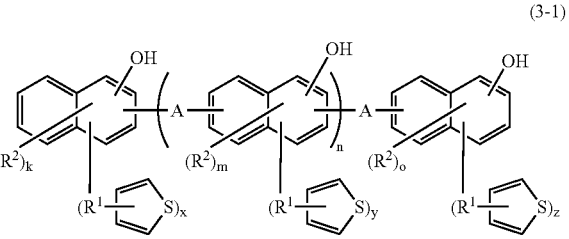
(3-1)

wherein $R^1$ represents a linear, branched, or cyclic hydrocarbon group having 1 to 8 carbon atoms; $R^2$s may be identical or different and each of them represents a hydrogen atom, halogen atom, hydroxyl group, phenyl group, or linear, branched, or cyclic alkyl or alkoxy group having 1 to 10 carbon atoms; connecting group A represents a hydrocarbon group having 1 to 20 carbon atoms; each of k, o, x and z represents an integer of 0 to 6; each of m and y represents an integer of 0 to 5; the sum of x, y, and z is an integer of 1 to 17; and the recurring unit number, n, represents an integer of 0 to 50.

5. The modified phenolic resin according to claim 3, wherein the connecting group A is at least one group selected from methylene group, xylylene groups, biphenylaralkyl groups, and groups represented by general formula (4-1) below:

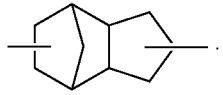

(4-1)

6. The modified phenolic resin according to claim 4, wherein the connecting group A is at least one group selected from methylene group, xylylene groups, biphenylaralkyl groups, and groups represented by general formula (4-1) below:

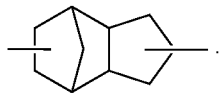

(4-1)

7. A method for producing the modified phenolic resin represented by general formula (2-1) according to claim 3, wherein a phenolic resin represented by general formula (5-1) and a compound represented by general formula (6-1) are reacted in the presence of an acid catalyst:

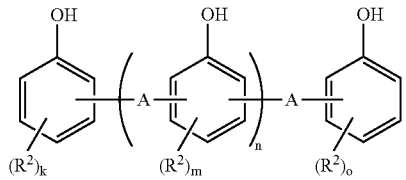

(5-1)

wherein $R^2$s may be identical or different and each of them represents a hydrogen atom, halogen atom, hydroxyl group, phenyl group, or linear, branched, or cyclic alkyl or alkoxy group having 1 to 10 carbon atoms; connecting group A represents a hydrocarbon group having 1 to 20 carbon atoms; k and o, each, represent an integer of 0 to 4; m represents an integer of 0 to 3; the recurring unit number, n, represents an integer of 0 to 50;

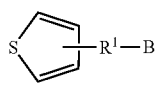

(6-1)

wherein $R^1$ represents a linear, branched, or cyclic hydrocarbon group having 1 to 8 carbon atoms; and B represents a hydroxyl group or halogen atom.

8. A method for producing the modified phenolic resin represented by general formula (3-1) according to claim 4, in which a phenolic resin represented by general formula (7-1) and the compound represented by general formula (6-1) are reacted in the presence of an acid catalyst:

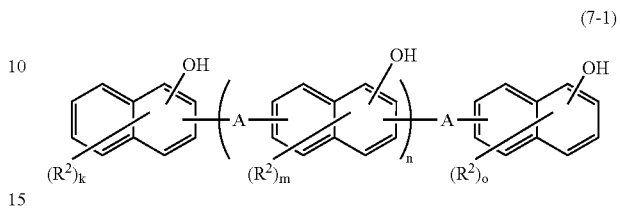

(7-1)

wherein $R^2$s may be identical or different and each represent a hydrogen atom, halogen atom, hydroxyl group, phenyl group, or linear, branched, or cyclic alkyl or alkoxy group having 1 to 10 carbon atoms; connecting group A represents a hydrocarbon group having 1 to 20 carbon atoms; k and o, each, represent an integer of 0 to 6; m represents an integer of 0 to 5; and the recurring unit number, n, represents an integer of 0 to 50

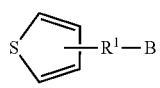

(6-1)

wherein $R^1$ represents a linear, branched, or cyclic hydrocarbon group having 1 to 8 carbon atoms; and B represents a hydroxyl group or halogen atom.

9. The method for producing the modified phenolic resin according to claim 7, wherein the connecting group A is at least one group selected from methylene group, xylylene groups, biphenylaralkyl groups, and the groups represented by general formula (4-1)

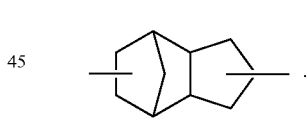

(4-1)

10. The method for producing the modified phenolic resin according to claim 8, wherein the connecting group A is at least one group selected from methylene group, xylylene groups, biphenylaralkyl groups, and the groups represented by general formula (4-1)

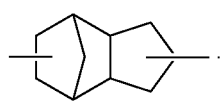

(4-1)

11. An epoxy resin composition comprising a bi- or poly-functional epoxy compound or bi- or poly-functional epoxy resin (A), a hardener (B), and a curing accelerator (C), wherein the hardener (B) is the modified phenolic resin according to any of claims 1 to 6.

12. The epoxy resin composition according to claim 11, which further contains 100 to 1900 parts by mass of an organic and/or inorganic filler (D) relative to 100 parts by mass of the total of the bi- or poly-functional epoxy compound or bi- or poly-functional epoxy resin (A) and the hardener (B).

13. A cured epoxy resin obtained by thermal-curing the epoxy resin composition according to claim 11.

14. A prepreg comprising a glass substrate impregnated with an epoxy resin composition, wherein said epoxy resin composition contains a bi- or poly-functional epoxy compound or bi- or poly-functional epoxy resin (A), a hardener (B), and a curing accelerator (C), wherein the hardener (B) is a modified phenolic resin that is an alternating copolymer of at least one phenolic compound selected from phenol, naphthols, and their derivatives and a compound having a divalent connecting group, said modified phenolic resin having a side chain attached to an aromatic ring having a hydroxy group, said side chain being represented by general formula (1-1):

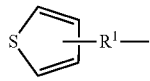

(1-1)

wherein $R^1$ represents a linear, branched, or cyclic hydrocarbon group having 1 to 8 carbon atoms.

15. The prepreg according to claim 14, wherein the hardener (B) is a modified phenolic resin in which a side chain of an aromatic ring having a hydroxyl group in a phenolic resin that is an alternating copolymer of at least one phenolic compound selected from phenol, naphthols, and their derivatives and a compound having a divalent connecting group, is substituted with a group represented by general formula (1-2):

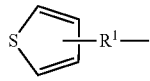

(1-2)

wherein $R^1$ represents an alkylene group having 1 to 3 carbon atoms, 1,4-cyclohexylene group, or phenylene group.

16. The prepreg according to claim 15, wherein the hardener (B) is a modified phenolic resin represented by general formula (2-2):

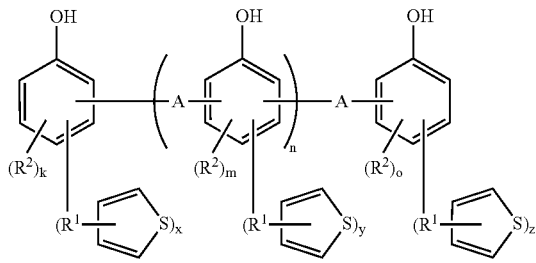

(2-2)

wherein $R^1$ represents an alkylene group having 1 to 3 carbon atoms, 1,4-cyclohexylene group, or phenylene group; $R^2$s may be identical or different and each of them represents a hydrogen atom, fluorine atom, chlorine atom, hydroxyl group, phenyl group, alkyl group having 1 to 3 carbon atoms, or alkoxy group having 1 to 3 carbon atoms; connecting group A represents an alkylene group having 1 to 3 carbon atoms, divalent alicyclic hydrocarbon group having 6 to 12 carbon atoms, phenylene group, xylylene group, or biphenylaralkyl group; each of k, o, x and z represents an integer of 0 to 4; each of m and y represents an integer of 0 to 3; the sum of x, y, and z is an integer of 1 to 11; and the recurring unit number, n, represents an integer of 0 to 50.

17. The prepreg according to claim 15, wherein the hardener (B) is a modified phenolic resin represented by general formula (3-2):

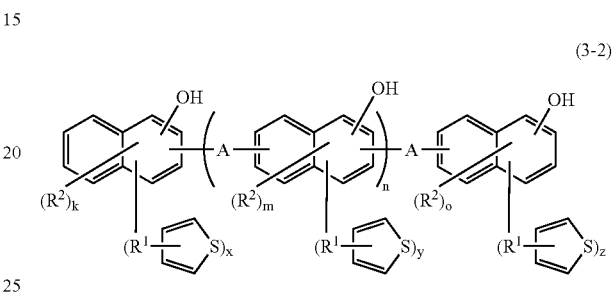

(3-2)

wherein $R^1$, $R^2$, connecting group A, k, o, x, z, m, y, and the recurring unit number, n, are as defined in general formula (2-2) above.

18. The prepreg according to claim 16, wherein connecting group A in the modified phenolic resin is at least one group selected from methylene group, xylylene groups, biphenylaralkyl groups, and groups represented by general formula (4-1) below:

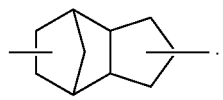

(4-1)

19. The prepreg according to claim 17, wherein the connecting group A in the modified phenolic resin is at least one group selected from methylene group, xylylene groups, biphenylaralkyl groups, and groups represented by general formula (4-1) below:

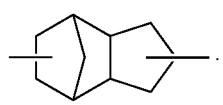

(4-1)

20. The prepreg according to claim 14, wherein the glass substrate is impregnated with an epoxy resin composition having an epoxy equivalent of 170 to 1000 g/eq.

21. The prepreg according to claim 15, wherein the glass substrate is impregnated with an epoxy resin composition having an epoxy equivalent of 170 to 1000 g/eq.

22. The prepreg according to claim 14, wherein the glass substrate is impregnated with an epoxy resin composition containing 2 to 150 parts by weight of the hardener (B) relative to 100 parts by weight of the bi- or poly-functional epoxy compound or bi- or poly-functional epoxy resin (A).

23. The prepreg according to claim 15, wherein the glass substrate is impregnated with an epoxy resin composition containing 2 to 150 parts by weight of the hardener (B) relative to 100 parts by weight of the bi- or poly-functional epoxy compound or bi- or poly-functional epoxy resin (A).

24. A laminate formed by stacking the prepregs according to any of claims 14 to 23.

25. An electronic circuit board made using the laminate according to claim 24.

26. A cured epoxy resin obtained by thermal-curing the epoxy resin composition according to claim 12.

* * * * *